US012532627B2

(12) United States Patent
Lee et al.

(10) Patent No.: US 12,532,627 B2
(45) Date of Patent: Jan. 20, 2026

(54) DISPLAY PANEL AND DISPLAY APPARATUS

(71) Applicant: SAMSUNG DISPLAY CO., LTD., Yongin-si (KR)

(72) Inventors: Kyunghoe Lee, Yongin-si (KR); Jisun Kim, Yongin-si (KR); Youngwan Seo, Yongin-si (KR); Keunhee Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 577 days.

(21) Appl. No.: 17/960,255

(22) Filed: Oct. 5, 2022

(65) Prior Publication Data

US 2023/0134423 A1 May 4, 2023

(30) Foreign Application Priority Data

Nov. 1, 2021 (KR) .......................... 10-2021-0148262

(51) Int. Cl.
*H10K 59/35* (2023.01)

(52) U.S. Cl.
CPC .................................. *H10K 59/353* (2023.02)

(58) Field of Classification Search
CPC ............. H10K 59/353; H10K 59/1213; H10K 59/352; H10K 59/30; H10K 59/121
See application file for complete search history.

(56) References Cited

U.S. PATENT DOCUMENTS

| 10,939,547 | B2 | 3/2021 | Lee et al. | |
| 2019/0269011 | A1* | 8/2019 | Lee | H05K 3/0014 |
| 2020/0163233 | A1 | 5/2020 | Brackley et al. | |
| 2020/0170126 | A1 | 5/2020 | Ahn et al. | |
| 2022/0077271 | A1 | 3/2022 | Lee et al. | |

FOREIGN PATENT DOCUMENTS

| CN | 112133733 A | 12/2020 |
| KR | 1020190102123 A | 9/2019 |
| KR | 1020200024930 A | 3/2020 |
| KR | 1020200063379 A | 6/2020 |
| KR | 1020220033574 A | 3/2022 |

\* cited by examiner

*Primary Examiner* — Tucker J Wright
(74) *Attorney, Agent, or Firm* — CANTOR COLBURN LLP

(57) ABSTRACT

The invention provides a display panel and a display apparatus. The display panel includes: a main display area and a corner area. The corner area includes: a middle area adjacent to a first display area; and a plurality of extension areas extending from the middle area in a direction away from the middle area. The plurality of extension areas each have a straight-line shape and the extension areas are apart from each other. The middle area includes a plurality of sub-areas corresponding to the plurality of extension areas, respectively, and the plurality of sub-areas each have a radial shape.

18 Claims, 29 Drawing Sheets

DISPLAY PANEL AND DISPLAY APPARATUS

This application claims priority to Korean Patent Application No. 10-2021-0148262, filed on Nov. 1, 2021, and all the benefits accruing therefrom under 35 U.S.C. § 119, the content of which in its entirety is herein incorporated by reference.

BACKGROUND

1. Field

One or more embodiments relate to a display panel and a display apparatus, and more particularly, to a display panel and a display apparatus having bent edges.

2. Description of the Related Art

With the miniaturization of various components for driving a display apparatus, the proportion of the display apparatus in an electronic device has gradually increased, and a structure to bend the display apparatus in a flat state to have a predetermined angle has been developed.

SUMMARY

One or more embodiments provide a display panel and a display apparatus having improved reliability, where luminance non-uniformity between a main display area and a corner area may be minimized.

Additional aspects will be set forth in part in the description which follows and, in part, will be apparent from the description, or may be learned by practice of the presented embodiments of the disclosure.

According to one or more embodiments, a display panel includes: a substrate including a first display area and a second display area; and a plurality of pixels arranged in the first display area and the second display area of the substrate. The first display area includes: a center area having a planar shape, a first area adjacent to the center area in a first direction, and a second area adjacent to the center area in a second direction crossing the first direction. The second display area includes a corner area between the first area and the second area. The corner area includes: a middle area adjacent to the first display area; and a plurality of extension areas extending from the middle area in a direction away from the middle area. The plurality of extension areas each have a straight-line shape, the plurality of extension areas are apart from each other, the middle area includes a plurality of sub-areas corresponding to the plurality of extension areas, respectively, and the plurality of sub-areas each have a radial shape.

A pixel unit may be arranged along a plurality of columns parallel to each other in each of the plurality of extension areas, the pixel unit may be a sub set of the plurality of pixels, and the pixel unit may be arranged along a plurality of columns each having a radial shape in each of the plurality of sub-areas.

A pixel arranged in a column having a radiation angle of 0 degree among the plurality of columns of each sub-area among the plurality of pixels may be a reference pixel among the plurality of pixels, and pixels arranged in each of the plurality of columns of each extension area among the plurality of pixels may be arranged in a same manner as the reference pixel.

A pixel arranged in a column having a radiation angle of 0 degree among the plurality of columns of each sub-area among the plurality of pixels may be a reference pixel among the plurality of pixels, and pixels arranged in each of the plurality of columns of each extension area among the plurality of pixels may be rotated by a radiation angle of a corresponding column of a corresponding sub-area of the plurality of sub-areas with respect to the reference pixel.

A pixel arrangement structure of the pixels of the pixel unit may be different from a pixel arrangement structure of the first display area.

A pixel arrangement structure of the pixels of the pixel unit may be the same as a pixel arrangement structure of the first display area.

A pixel arrangement structure of the pixels of the pixel unit may include a pentile structure, a stripe structure, or an S-stripe structure.

The pixel unit may include a first pixel, a second pixel, and a third pixel, which emit light of different colors, and the plurality of columns in each extension area may include a first column and a second column in which the first to third pixels arranged in the pixel unit have different positions according to a pixel arrangement structure, and the first column and the second column may be alternately arranged.

The plurality of extension areas may include a first extension area and a second extension area adjacent to each other, and the plurality of sub-areas may include a first sub-area corresponding to the first extension area and a second sub-area corresponding to the second extension area, and in a state in which the first extension area and the second extension area are unbent, emission pitches of the pixels in the middle area, arranged adjacent to a boundary between the first display area and the middle area among the plurality of pixels may be the same in the first sub-area, in the second sub-area, and between the first sub-area and the second sub-area, and emission pitches of the pixels in the plurality of extension areas, arranged adjacent to a boundary between the middle area and the plurality of extension areas among the plurality of pixels may be the same in the first extension area, in the second extension area, and between the first extension area and the second extension area.

In a state in which the first extension area and the second extension area are bent, emission pitches of the pixels in the first extension area and the second extension area, arranged adjacent to an end of the first extension area and an end of the second extension area among the plurality of pixels may be the same in the first extension area, in the second extension area, and between the first extension area and the second extension area.

In the state in which the first extension area and the second extension area are bent, the emission pitches of the pixels arranged adjacent to the boundary between the middle area and the plurality of extension areas may be the same as the emission pitches of the pixels arranged adjacent to the end of the first extension area and the end of the second extension area, in the first extension area, in the second extension area, and between the first extension area and the second extension area.

According to one or more embodiments, a display apparatus includes: a display panel, and a cover window arranged on the display panel. The display panel includes: a substrate including a first display area and a second display area; and a plurality of pixels arranged in the first display area and the second display area of the substrate. The first display area includes a center area having a planar shape, a first area adjacent to the center area in a first direction, and a second area adjacent to the center area in a second direction crossing the first direction, the second display area includes a corner area between the first area and the second area. The corner area includes: a middle area adjacent to the first display area; and a plurality of extension areas extending from the middle area in a direction away from the middle area. The plurality of extension areas each have a straight-line shape, and the plurality of extension areas are apart from each other. The middle area includes a plurality of sub-areas corresponding to the plurality of extension areas, respectively, and the plurality of sub-areas each have a radial shape.

A pixel unit may be arranged along a plurality of columns parallel to each other in each of the plurality of extension areas, the pixel unit may be a sub set of the plurality of pixels, and the pixel unit may be arranged along a plurality of columns each having a radial shape in each of the plurality of sub-areas.

A pixel arranged in a column having a radiation angle of 0 degree among the plurality of columns of each sub-area among the plurality of pixels may be a reference pixel among the plurality of pixels, and pixels arranged in each of the plurality of columns of each extension area among the plurality of pixels may be arranged in a same manner as the reference pixel.

A pixel arranged in a column having a radiation angle of 0 degree among the plurality of columns of each sub-area among the plurality of pixels may be a reference pixel among the plurality of pixels, and pixels arranged in each of the plurality of columns of each extension area among the plurality of pixels may be rotated by a radiation angle of a corresponding column of a corresponding sub-area of the plurality of sub-areas with respect to the reference pixel.

A pixel arrangement structure of the pixels of the pixel unit may be the same as or different from a pixel arrangement structure of the first display area, and the pixel arrangement structure of the pixels of the pixel unit may include a pentile structure, a stripe structure, or an S-stripe structure.

The pixel unit may include a first pixel, a second pixel, and a third pixel, which emit light of different colors, and the plurality of columns in each extension area may include a first column and a second column in which the first to third pixels arranged in the pixel unit have different positions according to a pixel arrangement structure, and the first column and the second column may be alternately arranged.

The plurality of extension areas may include a first extension area and a second extension area adjacent to each other, and the plurality of sub-areas may include a first sub-area corresponding to the first extension area and a second sub-area corresponding to the second extension area, and in a state in which the first extension area and the second extension area are unbent, emission pitches of the pixels in the middle area, arranged adjacent to a boundary between the first display area and the middle area among the plurality of pixels may be the same in the first sub-area, in the second sub-area, and between the first sub-area and the second sub-area, and emission pitches of the pixels in the plurality of extension areas, arranged adjacent to a boundary between the middle area and the plurality of extension areas among the plurality of pixels may be the same in the first extension area, in the second extension area, and between the first extension area and the second extension area.

In a state in which the first extension area and the second extension area are bent, emission pitches of the pixels in the first extension area and the second extension area, arranged adjacent to an end of the first extension area and an end of the second extension area among the plurality of pixels may be the same in the first extension area, in the second extension area, and between the first extension area and the second extension area.

In the state in which the first extension area and the second extension area are bent, the emission pitches of the pixels arranged adjacent to the boundary between the middle area and the plurality of extension areas may be the same as the emission pitches of the pixels arranged adjacent to the end of the first extension area and the end of the second extension area, in the first extension area, in the second extension area, and between the first extension area and the second extension area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
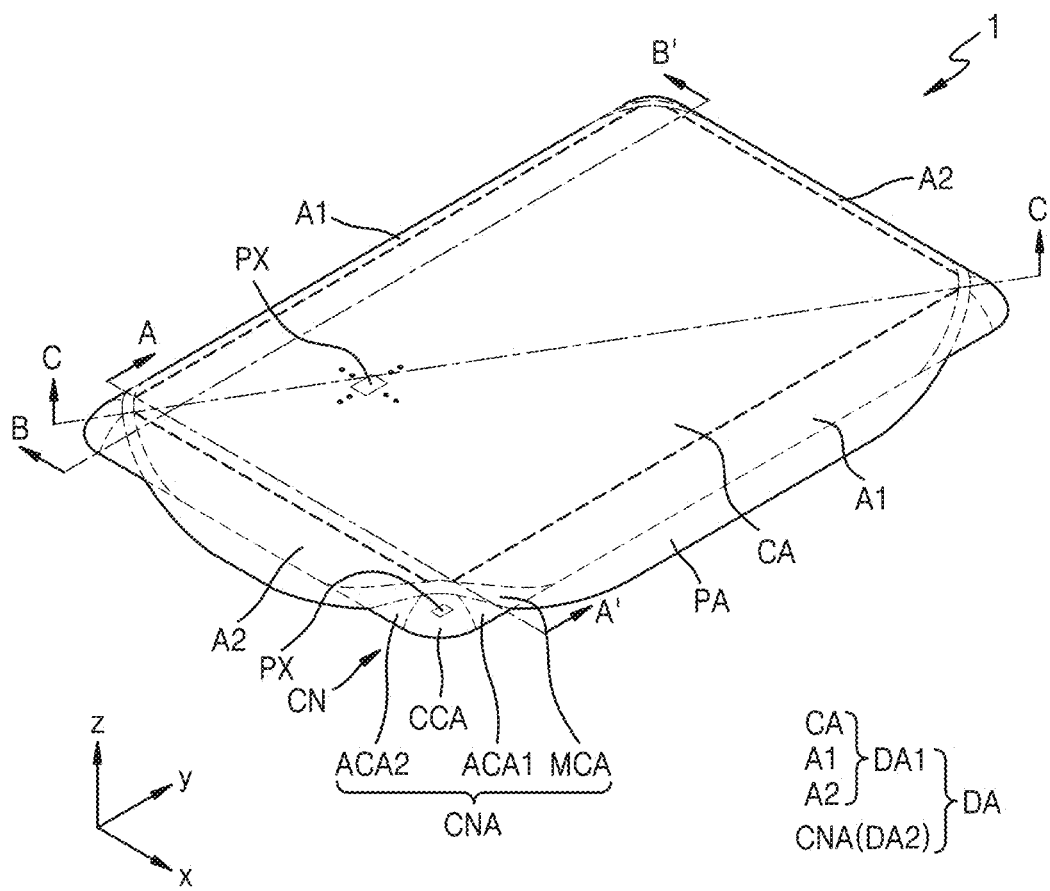
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the embodiments disclosed hereinafter and may be realized in various forms.

Hereinafter, embodiments of the disclosure will be described in detail with reference to the accompanying drawings, and in the description with reference to the drawings, like reference numerals will denote like elements and redundant descriptions thereof will be omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be understood that the terms "comprise," "comprising," "include" and/or "including" as used herein specify the presence of stated features or elements but do not preclude the addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

It will be understood that when a layer, region, or element is referred to as being "connected to" another layer, region, or element, it may be "directly connected to" the other layer, region, or element and/or may be "indirectly connected to" the other layer, region, or element with one or more intervening layers, regions, or elements therebetween. For example, when a layer, region, or element is referred to as being "electrically connected to" another layer, region, or element, it may be "directly electrically connected to" the other layer, region, or element and/or may be "indirectly electrically connected to" the other layer, region, or element with one or more intervening layers, regions, or elements therebetween.

In the present specification, "A and/or B" means A or B, or A and B. In the present specification, "at least one of A and B" means A or B, or A and B.

According to embodiments, "on a plane" denotes that a target portion is viewed from above and "on a cross-section" means that a vertically cut cross-section of a target portion is viewed from a side. According to embodiments, when a first element "overlaps" a second element, the first element may be located on or below the second element.

A display apparatus may be an apparatus displaying a video or a static image and may be used as a display screen of various products including not only portable electronic devices, such as a mobile phone, a smartphone, a tablet personal computer ("PC"), a mobile communication terminal, an electronic notebook, an electronic book, a portable multimedia player ("PMP"), a navigation device, and an ultra mobile PC ("UMPC"), but also other devices, such as a television, a notebook computer, a monitor, a billboard, and an Internet of things ("IoT") device. Also, the display apparatus according to an embodiment may be used in wearable devices, such as a smart watch, a watch phone, a glasses-type display, and a head-mounted display ("HMD"). Also, the display apparatus according to an embodiment may be used as: a gauge of a vehicle, a center fascia of a vehicle, or a center information display on a dashboard; a room mirror display substituting a side-view mirror of a vehicle; or a display arranged on a rear surface of a front seat, as an entertainment device for a backseat of a vehicle.

Figure 2A:
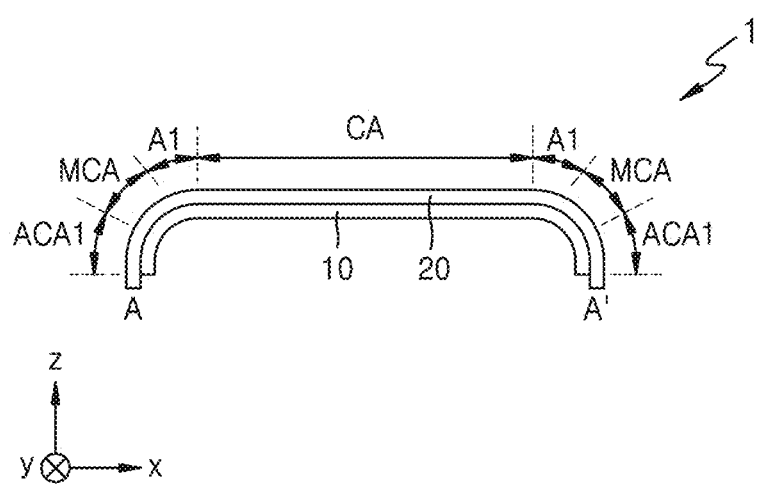
FIG. 2A is a cross-sectional view of the display apparatus of FIG. 1, taken along line A-A'.
Figure 2B:
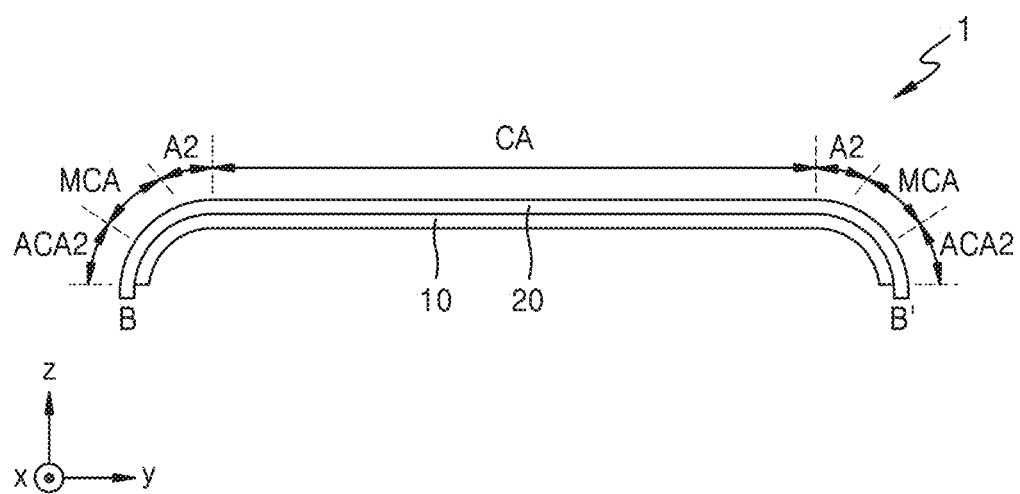
FIG. 2B is a cross-sectional view of the display apparatus of FIG. 1, taken along line B-B'.
Figure 2C:
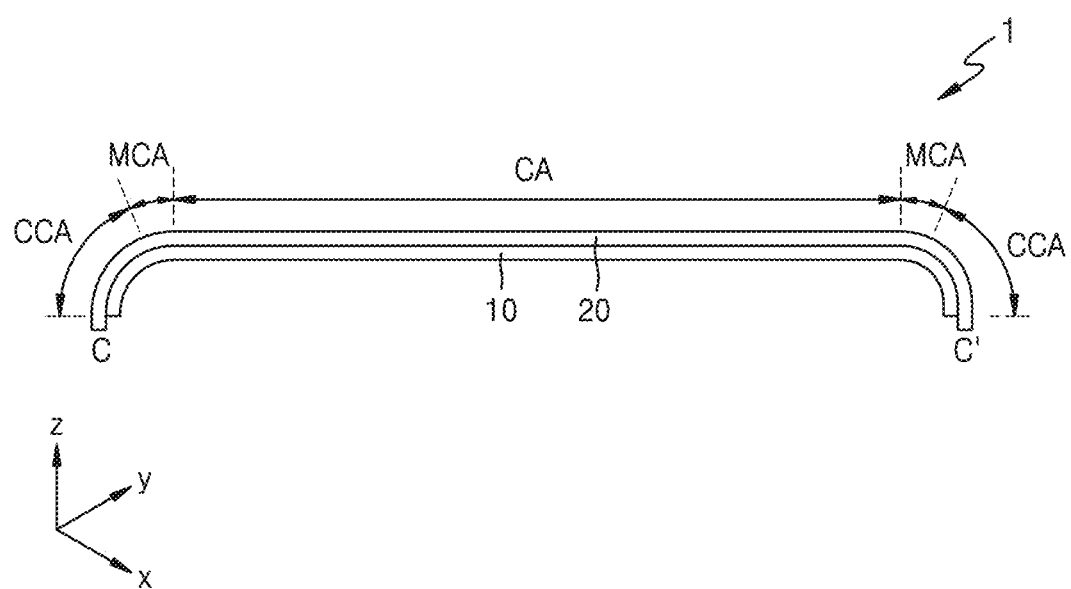
FIG. 2C is a cross-sectional view of the display apparatus of FIG. 1, taken along line C-C'.
Figure 3:
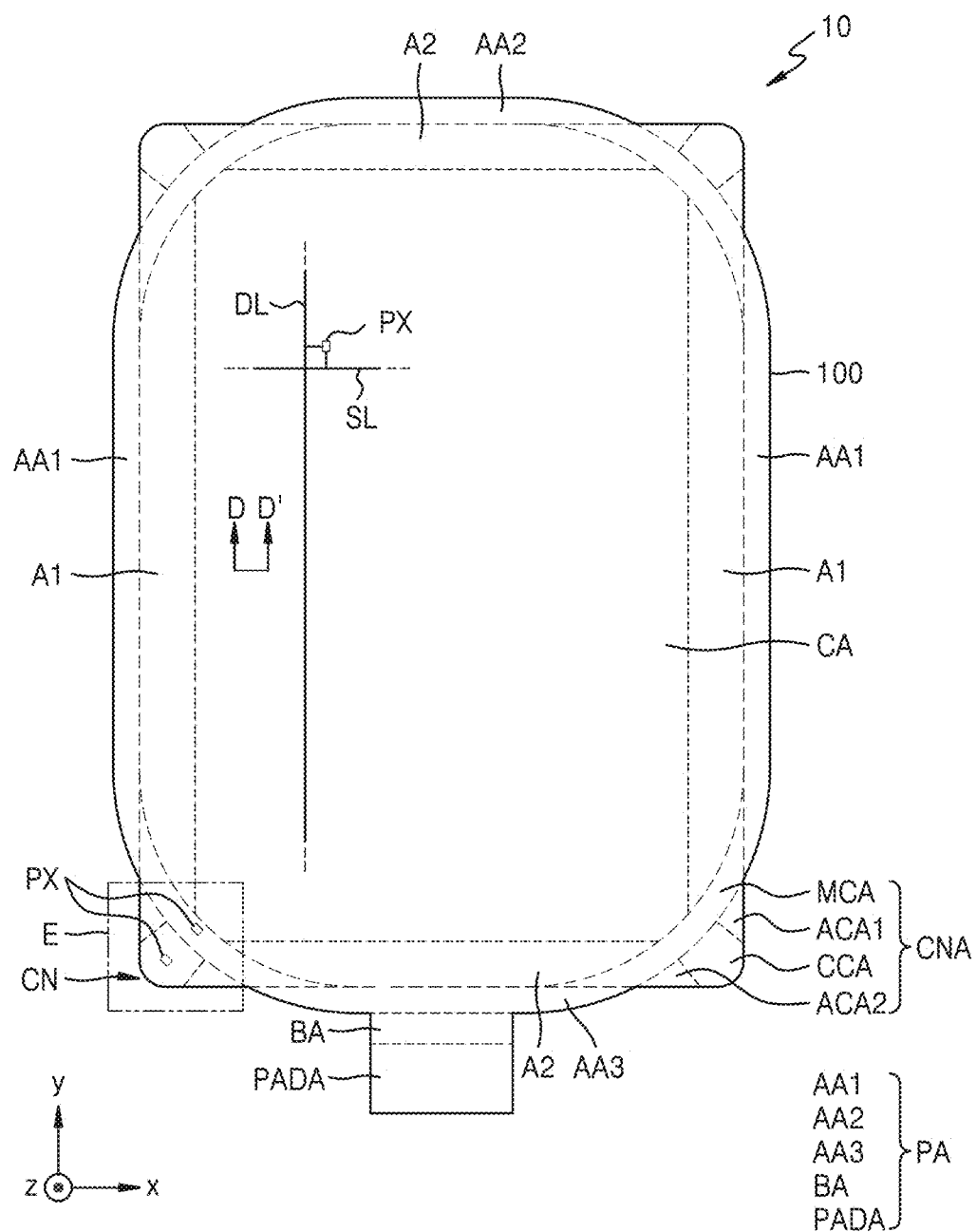
FIG. 3 is a schematic plan view of a display panel according to an embodiment.

FIG. 1 is a schematic perspective view of a display apparatus 1 according to an embodiment. FIG. 2A is a cross-sectional view of the display apparatus 1 of FIG. 1, taken along line A-A'. FIG. 2B is a cross-sectional view of the display apparatus 1 of FIG. 1, taken along line B-B'. FIG. 2C is a cross-sectional view of the display apparatus 1 of FIG. 1, taken along line C-C'. FIG. 3 is a schematic plan view of a display panel 10 according to an embodiment. FIG. 1 is a view of the display panel 10 in a bent state, and FIG. 3 is a view of the display panel 10 in an unbent state.

Referring to FIGS. 1 to 3, the display apparatus 1 may have an edge in a first direction and an edge in a second direction. Here, the first direction and the second direction may cross each other. For example, the first direction and the second direction may form an acute angle with each other. As another example, the first direction and the second direction may form an obtuse angle with each other or cross each other at right angles. Hereinafter, a case in which the first direction and the second direction cross each other at right angles is mainly described in detail. For example, the first direction may be x direction or −x direction, and the second direction may be y direction or −y direction. The third direction perpendicular to the first direction and the second direction may be z direction or −z direction.

The display apparatus 1 may include the display panel 10 and a cover window 20.

The display panel 10 may include a display area DA and a peripheral area PA. The display area DA may include a first display area DA1 and a second display area DA2. The display area DA and the peripheral area PA may be defined on a substrate 100 of the display panel 10. That is, the substrate 100 may include the display area DA and the peripheral area PA.

The first display area DA1 may include a center area CA that is substantially flat, and a first area A1 and a second area A2 that are side display areas adjacent to the center area CA. The first display area DA1 may be a main display screen of the display apparatus 1. The second display area DA2 may include a corner area CNA.

The first area A1 may be adjacent to the center area CA in the first direction. The first area A1 may be an area extending in the first direction from an edge of the center area CA in the second direction to be bent. The first area A1 may be an area bent from a boundary with the center area CA in a cross-section in the first direction (e.g., an xz cross-section: cross-section by xz plane). FIG. 2A illustrates that the first area A1 extending in the x direction from the center area CA to be bent and the first area A1 extending in the −x direction from the center area CA to be bent have the same curvature. In another embodiment, the first area A1 extending in the x direction from the center area CA to be bent and the first area A1 extending in the −x direction from the center area CA to be bent may have different curvatures.

The second area A2 may be adjacent to the center area CA in the second direction. The second area A2 may extend in the second direction from an edge of the center area CA in the first direction to be bent. The second area A2 may be an area bent from a boundary with the center area CA in a cross-section in the second direction (e.g., a yz cross-section: cross-section by yz plane). FIG. 2B illustrates that the second area A2 extending in the y direction from the center area CA to be bent and the second area A2 extending in the −y direction from the center area CA to be bent have the same curvature. In another embodiment, the second area A2 extending in the y direction from the center area CA to be bent and the second area A2 extending in the −y direction from the center area CA to be bent may have different curvatures.

The corner area CNA may be an area arranged at a corner CN of the display apparatus 1. In an embodiment, the corner area CNA may be an area where the edge of the display apparatus 1 in the first direction meets the edge of the display apparatus 1 in the second direction. The corner area CNA may be an area between the first area A1 and the second area A2. In an embodiment, the corner CN may have a predetermined curvature. When the first area A1 extends in the first direction to be bent and the second area A2 extends in the second direction to be bent, at least a portion of the corner area CNA may extend in the first direction to be bent and may extend in the second direction to be bent. At least a portion of the corner area CNA may be an area where a plurality of curvatures in a plurality of directions overlap. A plurality of corner areas CNA may be provided. FIGS. 1 and 3 illustrate four corner areas CNA. The corner area CNA may include a central corner area CCA, a first adjacent area ACA1, a second adjacent area ACA2, and a middle area MCA.

The central corner area CCA may extend in the first direction and the second direction to be bent. The central corner area CCA may be bent in the cross-section in the first direction (e.g., the xz cross-section) and the cross-section in the second direction (e.g., the yz cross-section). The central corner area CCA may be an area where curvatures in a plurality of directions overlap. The central corner area CCA may be arranged between the first adjacent area ACA1 and the second adjacent area ACA2.

The first adjacent area ACA1 may be adjacent to the central corner area CCA. In an embodiment, the first adjacent area ACA1 may be arranged between the central corner area CCA and the first area A1. That is, at least a portion of the first area A1 may be arranged between the center area CA and the first adjacent area ACA1 in the first direction. The first adjacent area ACA1 may be defined as the corner area CNA that is bent in the cross-section in the first direction (e.g., the xz cross-section) and is not substantially bent in the cross-section in the second direction (e.g., the yz cross-section).

The second adjacent area ACA2 may be adjacent to the central corner area CCA. In an embodiment, the second adjacent area ACA2 may be arranged between the central corner area CCA and the second area A2. That is, at least a portion of the second area A2 may be arranged between the center area CA and the second adjacent area ACA2 in the second direction. The second adjacent area ACA2 may be defined as the corner area CNA that is bent in the cross-section in the second direction (e.g., the yz cross-section) and is not substantially bent in the cross-section in the first direction (e.g., the xz cross-section).

The middle area MCA may be adjacent to the first display area DA1. The middle area MCA may be arranged between the first area A1 and the central corner area CCA. In an embodiment, the middle area MCA may extend between the first area A1 and the first adjacent area ACA1. In an embodiment, the middle area MCA may extend between the second area A2 and the second adjacent area ACA2. In an embodiment, the middle area MCA may be bent.

A plurality of pixels PX may be arranged in at least one of the center area CA, the first area A1, the second area A2, and the corner area CNA. Each of the plurality of pixels PX may be connected to a scan line SL and a data line DL and may include a display element. In an embodiment, the display element may be an organic light-emitting diode including an organic emission layer. Alternatively, the display element may be a light-emitting diode including an inorganic emission layer. A size of the light-emitting diode may be micro-scale or nano-scale. For example, the light-emitting diode may be a micro-light-emitting diode. Alternatively, the light-emitting diode may be a nanorod light-emitting diode. The nanorod light-emitting diode may include gallium nitride (GaN). In an embodiment, a color conversion layer may be arranged on the nanorod light-emitting diode. The color conversion layer may include quantum dots. Alternatively, the display element may include a quantum dot light-emitting diode including a quantum dot emission layer.

Each of the pixels PX may emit light of a predetermined color by using the display element. In an embodiment, the plurality of pixels PX may include red pixels, green pixels, and blue pixels. Alternatively, the plurality of pixels PX may include red pixels, green pixels, blue pixels, and white pixels. In the present specification, a pixel denotes an emission area realizing an image in a minimum unit. Accordingly, in the present specification, an arrangement of pixels may denote an arrangement of display elements or an arrangement of emission areas. When the organic light-emitting diode is implemented as the display element, an emission area may be defined by an opening of a pixel-defining layer. This aspect will be described below.

The peripheral area PA may be arranged outside the first display area DA1. The pixel PX may not be arranged in the peripheral area PA. Accordingly, the peripheral area PA may be a non-display area where an image is not displayed. The peripheral area PA may include a first peripheral area AA1, a second peripheral area AA2, a third peripheral area AA3, a bending area BA, and a pad area PADA.

The first peripheral area AA1 may be arranged outside the first area A1. The first area A1 may be arranged between the first peripheral area AA1 and the center area CA. The center area CA may be arranged between a pair of first peripheral areas AA1 facing each other. In an embodiment, the first peripheral area AA1 may extend from the first area A1 in the first direction.

The second peripheral area AA2 may be arranged outside the second area A2 on a top side of the display panel 10, and the second area A2 on the top side may be arranged between the second peripheral area AA2 and the center area CA. The third peripheral area AA3 may be arranged outside the second area A2 on a bottom side of the display panel 10, and the second area A2 on the bottom side may be arranged between the third peripheral area AA3 and the center area CA. The second peripheral area AA2 and the third peripheral area AA3 may extend in the second direction. The center area CA may be arranged between the second peripheral area AA2 and the third peripheral area AA3.

A driving circuit for providing an electrical signal to the pixel PX and/or power lines for providing power to the pixel PX may be arranged in the middle area MCA and the peripheral area PA. In an embodiment, the driving circuit and/or power lines may be arranged in the middle area MCA and the first peripheral area AA1. The pixel PX arranged in the middle area MCA may overlap the driving circuit and/or power lines of the middle area MCA in a plan view. In an embodiment, a display element of the pixel PX arranged in the middle area MCA may partially overlap the driving circuit and/or power lines of the middle area MCA, and a pixel circuit of the pixel PX may be apart from the driving circuit and/or power lines on the same layer without overlapping the driving circuit and/or power lines in a plan view.

The driving circuit may provide a signal to each pixel PX. In an embodiment, the driving circuit may be a scan driving circuit configured to provide a scan signal to each pixel PX through the scan line SL. Alternatively, the driving circuit may be an emission control driving circuit configured to provide an emission control signal to each pixel PX through an emission control line EL (see FIG. 4B). A data driving circuit may be arranged in the third peripheral area AA3 or the pad area PADA. Alternatively, the data driving circuit may be arranged on a circuit board connected to the display panel 10 through a pad.

The bending area BA may be arranged outside the second area A2. The bending area BA may be arranged outside the third peripheral area AA3. The third peripheral area AA3 may be arranged between the bending area BA and the center area CA. The display panel 10 may be bent in the bending area BA. In this case, the pad area PADA may face a rear surface of the display panel 10 that is opposite to an upper surface of the display panel 10 that displays an image. Accordingly, the pad area PADA may not be visually recognized by a user.

The pad area PADA may be arranged outside the bending area BA. The bending area BA may be arranged between the third peripheral area AA3 and the pad area PADA. A pad (not shown) may be arranged in the pad area PADA. At least one of a driving chip and a printed circuit board electrically connected to the display panel 10 through the pad may be arranged in the pad area PADA. The display panel 10 may receive an electrical signal and/or a power voltage from the driving chip and the printed circuit board through the pad. At least one of the driving chip and the printed circuit board may be electrically connected to the pad through an anisotropic conductive film. The driving chip may include an integrated circuit ("IC"). The printed circuit board may be a flexible printed circuit board ("FPCB") or a rigid printed circuit board ("PCB").

The cover window 20 may be arranged on the display panel 10. The cover window 20 may protect the display panel 10. In an embodiment, the cover window 20 may be a flexible window. The cover window 20 may include glass, sapphire, or plastic. The cover window 20 may be, for example, ultra-thin glass ("UTG") or colorless polyimide ("CPI"). The cover window 20 may be attached to the display panel 10 by a transparent adhesive member such as an optically clear adhesive ("OCA") film.

Figure 4A:
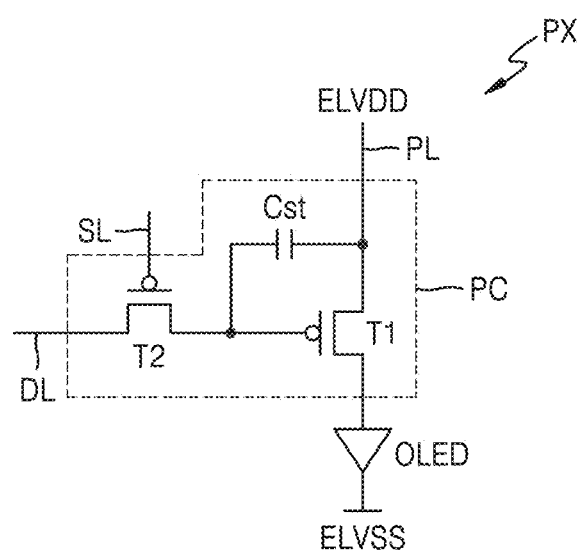
FIGS. 4A and 4B are each an equivalent circuit diagram of a pixel according to an embodiment.
Figure 4B:
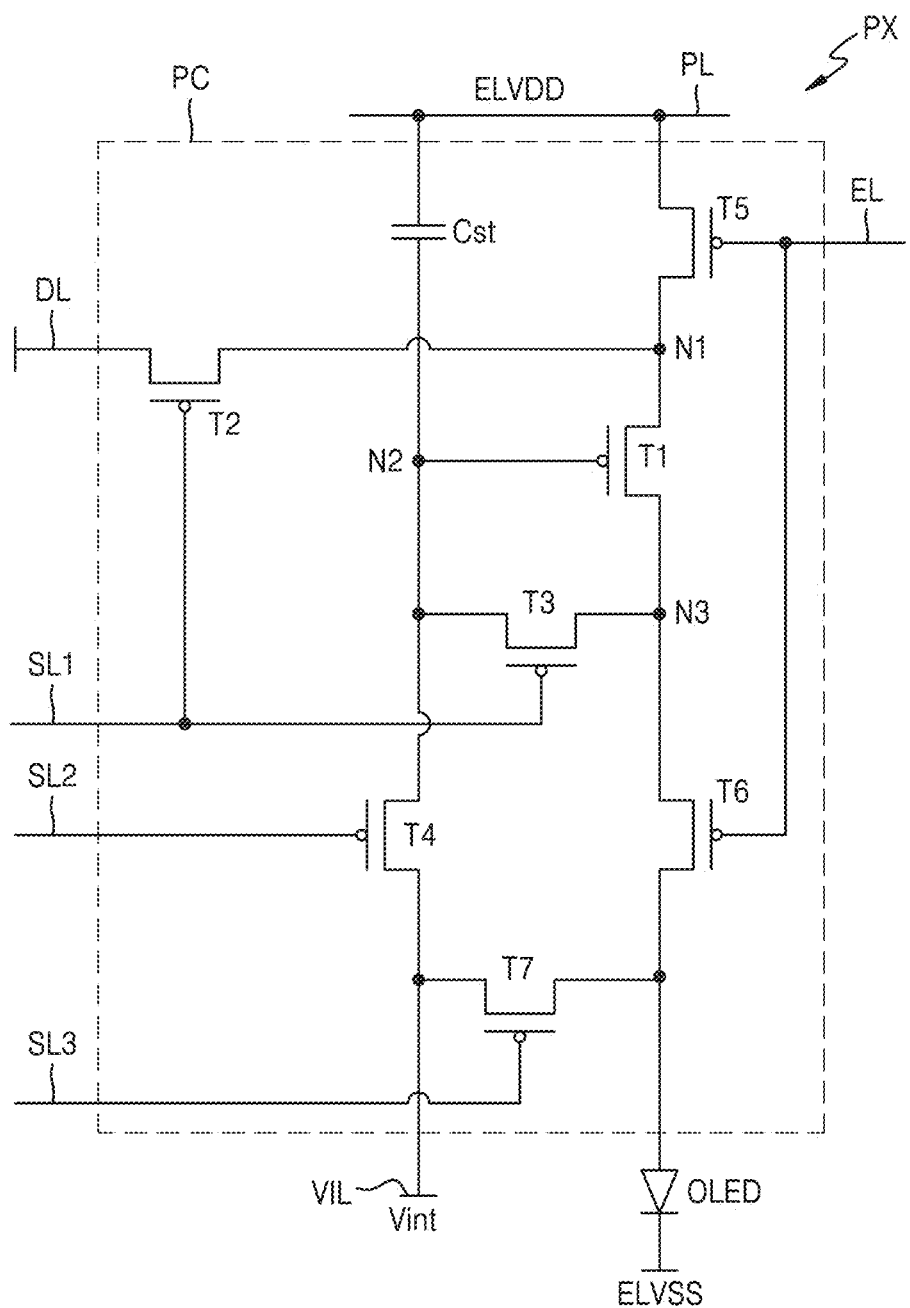

FIGS. 4A and 4B are each an equivalent circuit diagram of a pixel according to an embodiment.

Referring to FIG. 4A, the pixel PX includes a pixel circuit PC and an organic light-emitting diode OLED connected to the pixel circuit PC. The pixel circuit PC may include a first transistor T1, a second transistor T2, and a capacitor Cst.

Each pixel PX may emit, for example, red, green, blue, or white light through the organic light-emitting diode OLED. The first transistor T1 and the second transistor T2 may be implemented as thin-film transistors.

As a switching transistor, the second transistor T2 may be connected to a scan line SL and a data line DL, and may be configured to transmit a data signal input from the data line DL to the first transistor T1, in response to a scan signal input from the scan line SL. The capacitor Cst may be connected to the second transistor T2 and a driving voltage line PL, and may be configured to store charges corresponding to a voltage difference between a voltage corresponding to the data signal received from the second transistor T2 and a driving voltage ELVDD supplied to the driving voltage line PL.

As a driving transistor, the first transistor T1 may be connected to the driving voltage line PL and the capacitor Cst, and may be configured to control a driving current flowing from the driving voltage line PL through the organic light-emitting diode OLED, in accordance with a value of the voltage corresponding to the charges stored in the capacitor Cst. The organic light-emitting diode OLED may emit light having a predetermined luminance according to the driving current. An opposite electrode of the organic light-emitting diode OLED may be supplied with a common voltage ELVSS.

Although FIG. 4A illustrates that the pixel circuit PC includes two transistors and one capacitor, the disclosure is not limited thereto. The number of transistors and the number of capacitors may be variously modified according to a design of the pixel circuit PC.

Referring to FIG. 4B, the pixel circuit PC may include the first transistor T1 as a driving transistor and second to seventh transistors T2 to T7 as switching transistors. According to a type (P-type or N-type) of a transistor and/or an operating condition, a first terminal of each of the first to seventh transistors T1 to T7 may be a source terminal or a drain terminal, and a second terminal thereof may be a terminal different from the first terminal. For example, when the first terminal is a source terminal, the second terminal may be a drain terminal. In an embodiment, the source terminal and the drain terminal may be interchangeably referred to as a source electrode and a drain electrode, respectively, and the gate terminal may be interchangeably referred to as a gate electrode.

The pixel circuit PC may be connected to a first scan line SL1 configured to transmit a first scan signal, a second scan line SL2 configured to transmit a second scan signal, a third scan line SL3 configured to transmit a third scan signal, the emission control line EL configured to transmit an emission control signal, the data line DL configured to transmit a data signal, the driving voltage line PL configured to transmit the driving voltage ELVDD, and an initialization voltage line VIL configured to transmit an initialization voltage Vint.

The first transistor T1 may be connected between the driving voltage line PL and the organic light-emitting diode OLED. The first transistor T1 may be connected to the driving voltage line PL via the fifth transistor T5, and electrically connected to the organic light-emitting diode OLED via the sixth transistor T6. The first transistor T1 includes a gate terminal connected to a second node N2, a first terminal connected to a first node N1, and a second terminal connected to a third node N3. The first transistor T1 may be configured to receive a data signal according to a switching operation of the second transistor T2 and supply a driving current to the organic light-emitting diode OLED.

The second transistor T2 (a data writing transistor) may be connected between the data line DL and the first node N1 and connected to the driving voltage line PL through the fifth transistor T5. The first node N1 may be a node to which the first transistor T1 and the fifth transistor T5 are connected. The second transistor T2 includes a gate terminal connected to the first scan line SL1, a first terminal connected to the data line DL, and a second terminal connected to the first node N1 (or the first terminal of the first transistor T1). The second transistor T2 may be turned on according to a first scan signal received through the first scan line SL1 and may be configured to perform a switching operation of transmitting the data signal transmitted through the data line DL to the first node N1.

The third transistor T3 (a compensation transistor) may be connected between the second node N2 and the third node N3. The third transistor T3 may be connected to the organic light-emitting diode OLED via the sixth transistor T6. The second node N2 may be a node to which the gate terminal of the first transistor T1 is connected, and the third node N3 may be a node to which the first transistor T1 and the sixth transistor T6 are connected. The third transistor T3 includes a gate terminal connected to the first scan line SL1, a first terminal connected to the second node N2 (or the gate terminal of the first transistor T1), and a second terminal connected to the third node N3 (or the second terminal of the first transistor T1). The third transistor T3 may be turned on according to a first scan signal received through the first scan line SL1 and may be configured to compensate for a threshold voltage of the first transistor T1 by diode-connecting the first transistor T1.

The fourth transistor T4 (a first initialization transistor) may be connected between the second node N2 and the initialization voltage line VIL. The fourth transistor T4 includes a gate terminal connected to the second scan line SL2, a first terminal connected to the second node N2, and a second terminal connected to the initialization voltage line VIL. The fourth transistor T4 may be turned on according to a second scan signal received through the second scan line SL2 and may be configured to initialize a gate voltage of the first transistor T1 by transmitting the initialization voltage Vint to the gate terminal of the first transistor T1.

The fifth transistor T5 (a first emission control transistor) may be connected between the driving voltage line PL and the first node N1. The sixth transistor T6 (a second emission control transistor) may be connected between the third node N3 and the organic light-emitting diode OLED. The fifth transistor T5 includes a gate terminal connected to the emission control line EL, a first terminal connected to the driving voltage line PL, and a second terminal connected to the first node N1. The sixth transistor T6 includes a gate terminal connected to the emission control line EL, a first terminal connected to the third node N3, and a second terminal connected to a pixel electrode of the organic light-emitting diode OLED. The fifth transistor T5 and the sixth transistor T6 may be simultaneously turned on according to an emission control signal received through the emission control line EL, so that a current may flow through the organic light-emitting diode OLED.

The seventh transistor T7 (a second initialization transistor) may be connected between the organic light-emitting diode OLED and the initialization voltage line VIL. The seventh transistor T7 includes a gate terminal connected to the third scan line SL3, a first terminal connected to the second terminal of the sixth transistor T6 and the pixel electrode of the organic light-emitting diode OLED, and a second terminal connected to the initialization voltage line VIL. The seventh transistor T7 may be turned on according to a third scan signal received through the third scan line SL3 and may be configured to initialize a voltage of the pixel electrode of the organic light-emitting diode OLED by transmitting the initialization voltage Vint to the pixel electrode of the organic light-emitting diode OLED. The seventh transistor T7 may be omitted.

The capacitor Cst includes a first electrode connected to the second node N2 and a second electrode connected to the driving voltage line PL. The capacitor Cst may maintain a voltage applied to the gate electrode of the first transistor T1 by storing and maintaining charges corresponding to a voltage difference between voltages supplied to opposite ends of the first electrode and the second electrode, respectively.

The organic light-emitting diode OLED may include a pixel electrode (e.g., an anode) and an opposite electrode (e.g., a cathode) facing the pixel electrode, and the opposite electrode may receive the common voltage ELVSS. The organic light-emitting diode OLED may display an image by emitting light of a predetermined color by receiving a driving current corresponding to a value of the voltage corresponding to charges stored in the capacitor Cst from the first transistor T1.

In FIGS. 4A and 4B, transistors of the pixel circuit PC are P-type transistors, but embodiments of the disclosure are not limited thereto. For example, various embodiments are possible, such as the transistors of the pixel circuit PC may be N-type transistors, or some of the transistors may be P-type transistors and the remaining transistors may be N-type transistors.

Figure 5:
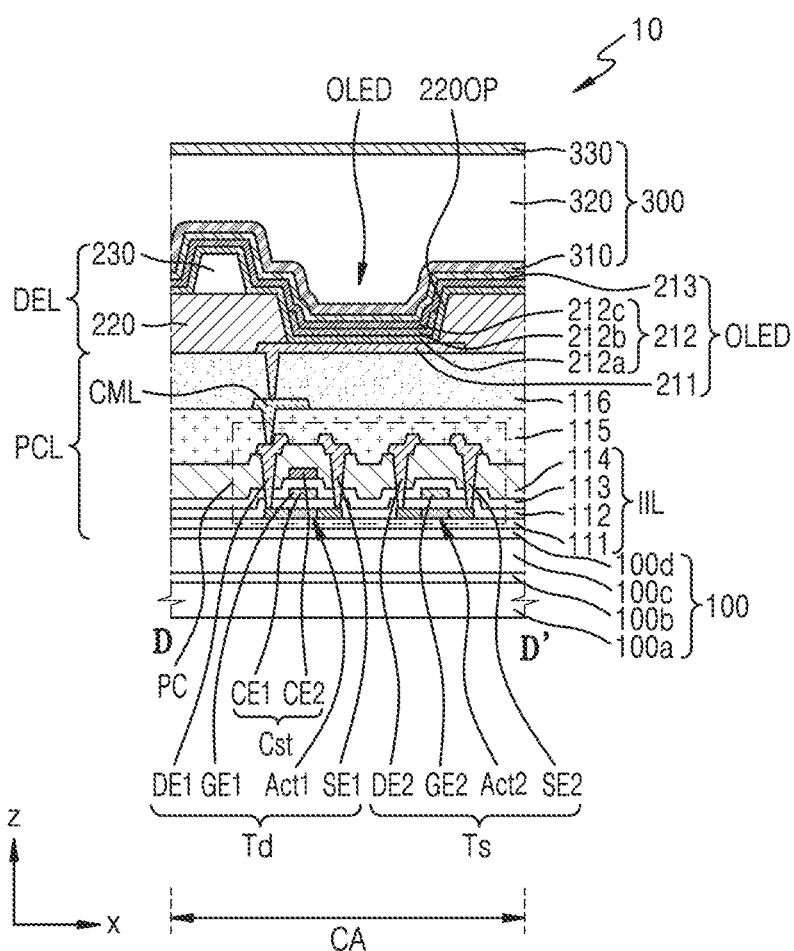
FIG. 5 is a schematic cross-sectional view of a first display area in the display panel of FIG. 3, taken along line D-D'.

FIG. 5 is a schematic cross-sectional view of the first display area DA1 in the display panel 10 of FIG. 3, taken along line D-D'.

Referring to FIG. 5, the display panel 10 may include the substrate 100, a pixel circuit layer PCL, a display element layer DEL, and an encapsulation layer 300.

The substrate 100 may include a flexible or bendable material. In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked on the substrate 100. In another embodiment, the substrate 100 may include glass.

At least one of the first base layer 100a and the second base layer 100c may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may prevent the penetration of external impurities and may include a single layer or layers including an inorganic material, such as silicon nitride ($SiN_x$), silicon oxide ($SiO_2$), and/or silicon oxynitride (SiON).

The pixel circuit layer PCL may be arranged on the substrate 100. The pixel circuit layer PCL may include the pixel circuit PC. The pixel circuit PC may include a driving thin-film transistor Td, a switching thin-film transistor Ts, and the capacitor Cst. The driving thin-film transistor Td may include a first semiconductor layer Act1, a first gate electrode GE1, a first source electrode SE1, and a first drain electrode DE1. The switching thin-film transistor Ts may include a second semiconductor layer Act2, a second gate electrode GE2, a second source electrode SE2, and a second drain electrode DE2. The second semiconductor layer Act2, the second gate electrode GE2, the second source electrode SE2, and the second drain electrode DE2 may be substantially the same as the first semiconductor layer Act1, the first gate electrode GE1, the first source electrode SE1, and the first drain electrode DE1, respectively, and thus, detailed descriptions thereof will be omitted.

The pixel circuit layer PCL may further include an inorganic insulating layer IIL, a first insulating layer 115, and a second insulating layer 116 arranged below and/or above components of the pixel circuit PC. The inorganic insulating layer IIL may include a buffer layer 111, a first gate insulating layer 112, a second gate insulating layer 113, and an interlayer insulating layer 114.

The buffer layer 111 may be arranged on the substrate 100. The buffer layer 111 may include an inorganic insulating material, such as $SiN_x$, SiON, and $SiO_2$, and may include a single layer or layers including the inorganic insulating materials described above.

The first semiconductor layer Act1 may be arranged on the buffer layer 111. The first semiconductor layer Act1 may include polysilicon. Alternatively, the first semiconductor layer Act1 may include amorphous silicon, oxide semiconductor, organic semiconductor, or the like. The first semiconductor layer Act1 may include a channel area, a drain area and a source area arranged on opposite sides of the channel area, respectively.

The first gate electrode GE1 may overlap the channel area in a plan view. The first gate electrode GE1 may include a low-resistance metal material. The first gate electrode GE1 may include a conductive material including Mo, Al, Cu, Ti, or the like, and may include layers or a single layer including the conductive materials described above.

The first gate insulating layer 112 between the first semiconductor layer Act1 and the first gate electrode GE1 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, $ZnO_x$ may be zinc oxide (ZnO) and/or zinc peroxide ($ZnO_2$).

The second gate insulating layer 113 may cover the first gate electrode GE1. The second gate insulating layer 113 may include an inorganic insulating material, such as $SiO_2$, $SiN_x$, SiON, $Al_2O_3$, $TiO_2$, $Ta_2O_5$, $HfO_2$, and/or $ZnO_x$, similar to the first gate insulating layer 112.

An upper electrode CE2 of the capacitor Cst may be arranged on the second gate insulating layer 113. The upper electrode CE2 may overlap the first gate electrode GE1 therebelow. The first gate electrode GE1 of the driving thin-film transistor Td may serve as a lower electrode CE1 of the capacitor Cst as well as a control electrode of the driving thin-film transistor Td. Accordingly, the capacitor Cst may overlap the driving thin-film transistor Td. In some embodiments, the capacitor Cst may not overlap the driving thin-film transistor Td in a plan view. The upper electrode CE2 may include Al, Pt, Pd, Ag, Mg, Au, Ni, Nd, Ir, Cr, Ca, Mo, Ti, W, and/or Cu and may include a single layer or layers including the materials described above.

The interlayer insulating layer 114 may cover the upper electrode CE2 of the capacitor Cst. The interlayer insulating layer 114 may include $SiO_2$, $SiN_x$, SiON, $Al_2O_3$, $TiO_2$, $Ta_2O_5$, $HfO_2$, $ZnO_x$, or the like. The interlayer insulating layer 114 may include a single layer or layers including the inorganic insulating materials described above.

Each of the first drain electrode DE1 and the first source electrode SE1 may be arranged on the interlayer insulating layer 114. The first drain electrode DE1 and the first source electrode SE1 may include a highly conductive material. The first drain electrode DE1 and the first source electrode SE1 may include a conductive material including Mo, Al, Cu, Ti, or the like, and may include layers or a single layer including the conductive materials described above. In an embodiment, the first drain electrode DE1 and the first source electrode SE1 may have a multi-layered structure of Ti/Al/Ti.

The first insulating layer 115 may be arranged on the first drain electrode DE1, the first source electrode SE1, the second drain electrode DE2, the second source electrode SE2, and the interlayer insulating layer 114. In an embodiment, the first insulating layer 115 may include an organic material. For example, the first insulating layer 115 may include an organic insulating material, such as a general-purpose polymer such as polymethylmethacrylate ("PMMA") or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A connection electrode CML may be arranged on the first insulating layer 115. The connection electrode CML may be electrically connected to the pixel circuit PC through a hole of the first insulating layer 115. In an embodiment, the connection electrode CML may be electrically connected to the first drain electrode DE1 or the first source electrode SE1. The connection electrode CML may include a highly conductive material. The connection electrode CML may include a conductive material including Mo, Al, Cu, Ti, or the like, and may include layers or a single layer including the conductive materials described above. In an embodiment, the connection electrode CML may have a multi-layered structure of Ti/Al/Ti.

The second insulating layer 116 may be arranged on the first insulating layer 115 and the connection electrode CML. In an embodiment, the second insulating layer 116 may include an organic material. The second insulating layer 116 may include an organic insulating material, such as a general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be arranged on the pixel circuit layer PCL. The display element layer DEL may include the organic light-emitting diode OLED as a display element and a pixel-defining layer 220. In an embodiment, the display element layer DEL may further include a spacer 230. The organic light-emitting diode OLED may be electrically connected to the connection electrode CML through a hole of the second insulating layer 116. The organic light-emitting diode OLED may include a pixel electrode 211, an interlayer 212, and an opposite electrode 213. In an embodiment, the organic light-emitting diode OLED may overlap the pixel circuit PC in a plan view.

The pixel electrode 211 may be arranged on the second insulating layer 116. The pixel electrode 211 may be electrically connected to the connection electrode CML through the hole of the second insulating layer 116. The pixel electrode 211 may include a conductive oxide, such as indium tin oxide ("ITO"), indium zinc oxide ("IZO"), ZnO, indium oxide ($In_2O_3$), indium gallium oxide ("IGO"), or aluminum zinc oxide ("AZO"). In another embodiment, the pixel electrode 211 may include a reflective layer including Ag, Mg, Al, Pt, Pd, Au, Ni, Nd, Ir, Cr, or a compound thereof. In another embodiment, the pixel electrode 211 may further include a layer including ITO, IZO, ZnO, or $In_2O_3$, above/below the reflective layer described above.

The pixel-defining layer 220 may have an opening 2200P exposing a portion of the pixel electrode 211 and may be arranged on the pixel electrode 211. The opening 2200P may define an emission area of light emitted by the organic light-emitting diode OLED. For example, a width of the opening 2200P may correspond to a width of the emission area. Also, the width of the opening 2200P may correspond to a width of a pixel.

In an embodiment, the pixel-defining layer 220 may include an organic insulating material. In another embodiment, the pixel-defining layer 220 may include an inorganic insulating material, such as $SiN_x$, SiON, or $SiO_2$. In another embodiment, the pixel-defining layer 220 may include an organic insulating material and an inorganic insulating material. In some embodiments, the pixel-defining layer 220 may include a light-blocking material and may be provided in a black color. The light-blocking material may include a resin or paste including carbon black, a carbon nano-tube, and a black dye, carbon black, a carbon nano-tube, a metal particle, such as Ni, Al, Mo, and an alloy thereof, a metal oxide (e.g., chromium oxide) particle, a metal nitride (e.g., chromium nitride) particle, or the like. When the pixel-defining layer 220 includes a light-blocking material, reflection of external light due to metal structures arranged below the pixel-defining layer 220 may be reduced.

The spacer 230 may be arranged on the pixel-defining layer 220. The spacer 230 may be provided to prevent the substrate 100 and/or the layers on the substrate 100 from being damaged when manufacturing a display apparatus. The spacer 230 may include an organic material such as polyimide. Alternatively, the spacer 230 may include an inorganic insulating material, such as $SiN_x$ or $SiO_2$, or may include an organic insulating material and an inorganic insulating material. In an embodiment, the spacer 230 may include a different material from the pixel-defining layer 220. Alternatively, in another embodiment, the spacer 230 may include the same material as the pixel-defining layer 220, and in this case, the pixel-defining layer 220 and the spacer 230 may be formed together as one body by a mask process using a halftone mask or the like.

The interlayer 212 may be arranged on the pixel-defining layer 220. The interlayer 212 may include an emission layer 212b arranged in the opening 2200P of the pixel-defining layer 220. The emission layer 212b may include a high molecular-weight or low molecular-weight organic material emitting light of a predetermined color.

The interlayer 212 may further include at least one of a first functional layer 212a between the pixel electrode 211 and the emission layer 212b and a second functional layer 212c between the emission layer 212b and the opposite electrode 213. In an embodiment, the first functional layer 212a and the second functional layer 212c may be arranged below and above the emission layer 212b, respectively. The first functional layer 212a may include a hole transport layer ("HTL"), or an HTL and a hole injection layer ("HIL"). The second functional layer 212c may include an electron transport layer ("ETL") and/or an electron injection layer ("EIL"). The first functional layer 212a and/or the second functional layer 212c may be a common layer formed to entirely cover the substrate 100, like the opposite electrode 213 to be described below.

The opposite electrode 213 may be arranged on the interlayer 212. The opposite electrode 213 may include a conductive material having a low work function. For example, the opposite electrode 213 may include a (semi-)transparent layer including Ag, Mg, Al, Pt, Pd, Au, Ni, Nd, Ir, Cr, Li, Ca, or an alloy thereof. Alternatively, the opposite electrode 213 may further include a layer including ITO, IZO, ZnO, or $In_2O_3$ on the (semi-)transparent layer including the materials described above.

In some embodiments, a capping layer (not shown) may further be arranged on the opposite electrode 213. The capping layer may include LiF, an inorganic material, or/and an organic material.

The encapsulation layer 300 may be arranged on the opposite electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330 that are sequentially stacked in this stated order.

The first inorganic encapsulation layer 310 and the second inorganic encapsulation layer 330 may include one or more inorganic materials from among $Al_2O_3$, $TiO_2$, $Ta_2O_5$, $HfO_2$, $ZnO_x$, $SiO_2$, $SiN_x$, and SiON. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

A touch sensor layer may be arranged on the encapsulation layer 300. The touch sensor layer may obtain coordinate information according to an external input, for example, a touch event.

An anti-reflection layer may be arranged on the touch sensor layer. The anti-reflection layer may reduce reflectivity of light that is incident toward the display panel 10.

In an embodiment, the anti-reflection layer may include a phase retarder and/or a polarizer. The phase retarder may be a film-type or a liquid crystal-coating type, and may include a $\lambda/2$ phase retarder and/or a $\lambda/4$ phase retarder. The polarizer may also be a film-type or a liquid crystal coating-type. The film-type polarizer may include a stretchable synthetic resin film, and the liquid crystal coating-type polarizer may include liquid crystals arranged in a predetermined arrangement. The phase retarder and the polarizer may further include a protective film.

In another embodiment, the anti-reflection layer may include a black matrix and color filters. The color filters may be arranged by taking into account a color of light emitted by the organic light-emitting diode OLED. Each of the color filters may include a red, green, or blue pigment or dye. Alternatively, each of the color filters may further include quantum dots in addition to the pigment or dye. Alternatively, some of the color filters may not include the pigment or dye, and may include scattering particles such as titanium oxide.

In another embodiment, the anti-reflection layer may include a destructive interference structure. The destructive interference structure may include a first reflective layer and a second reflective layer arranged on different layers from each other. First reflective light and second reflective light reflected by the first reflective layer and the second reflective layer, respectively, may destructively interfere with each other, and thus, the reflectivity of external light may be reduced.

Figure 6:
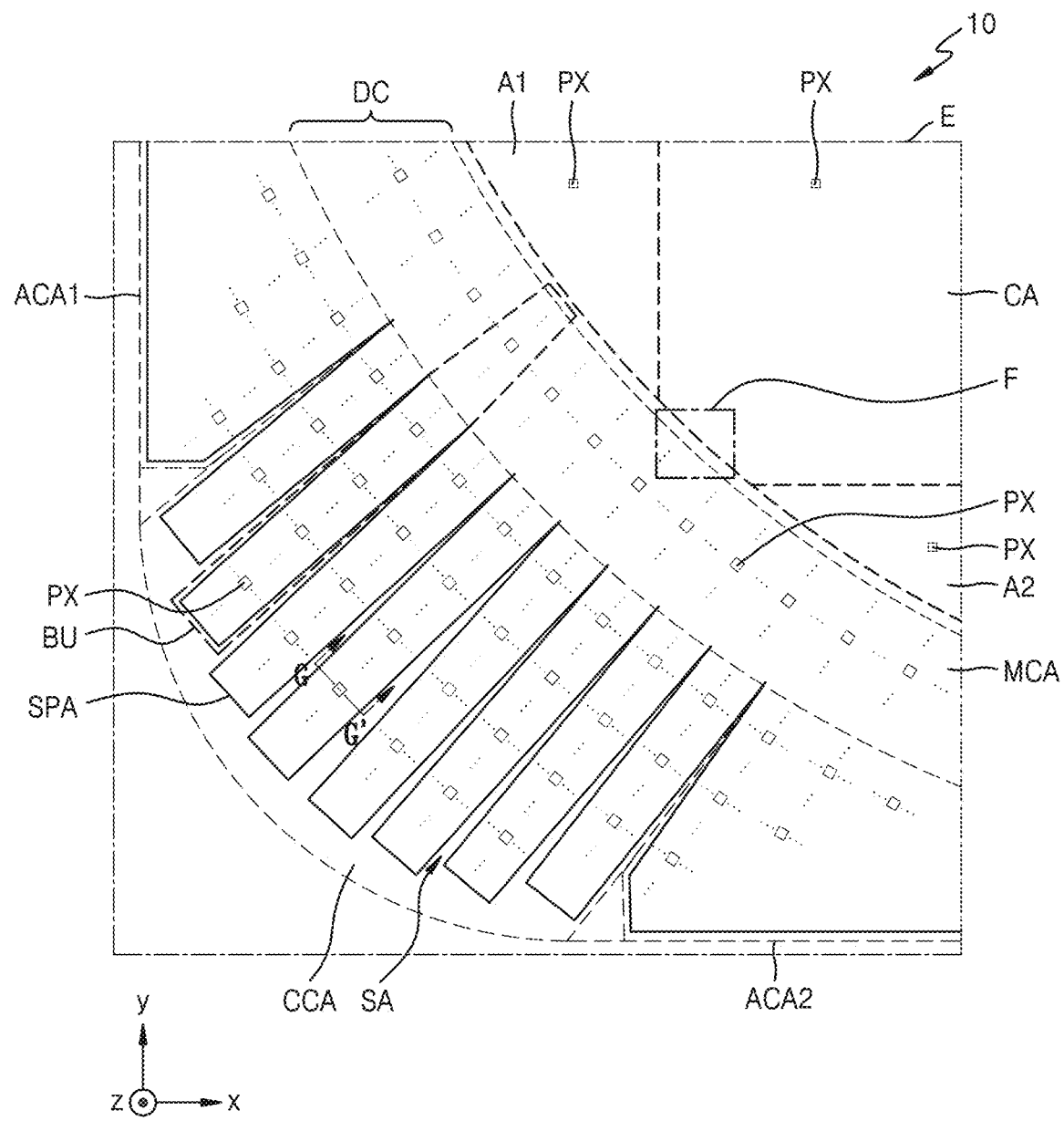
FIG. 6 is an enlarged view of a region E of the display panel of FIG. 3.
Figure 7A:
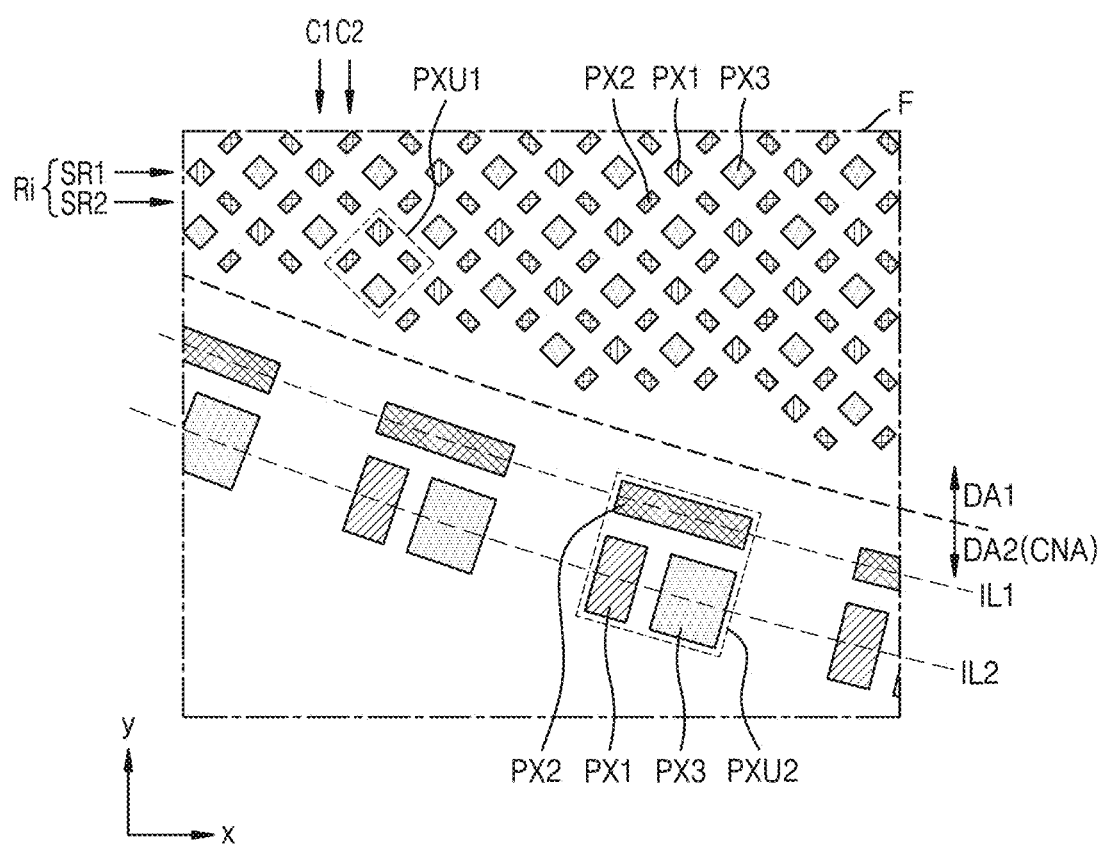
FIGS. 7A and 7B are enlarged views of a region F, which is a portion of the region E of FIG. 6.
Figure 7B:
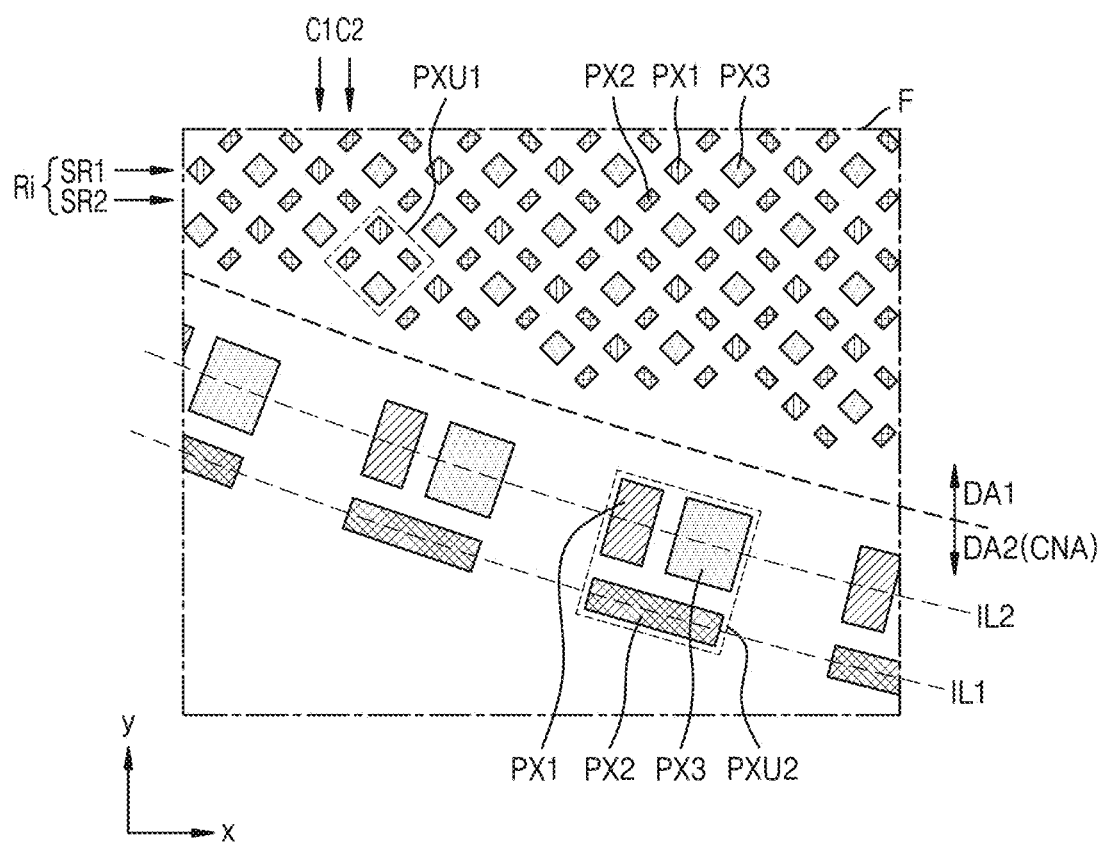
Figure 8A:
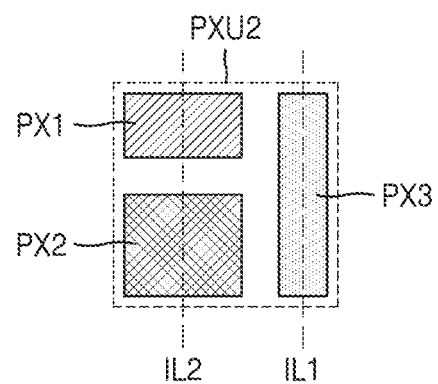
FIGS. 8A and 8B are each an example view of a configuration of a second pixel unit.
Figure 8B:
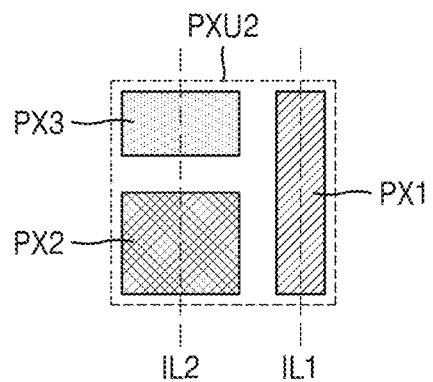
Figure 9A:
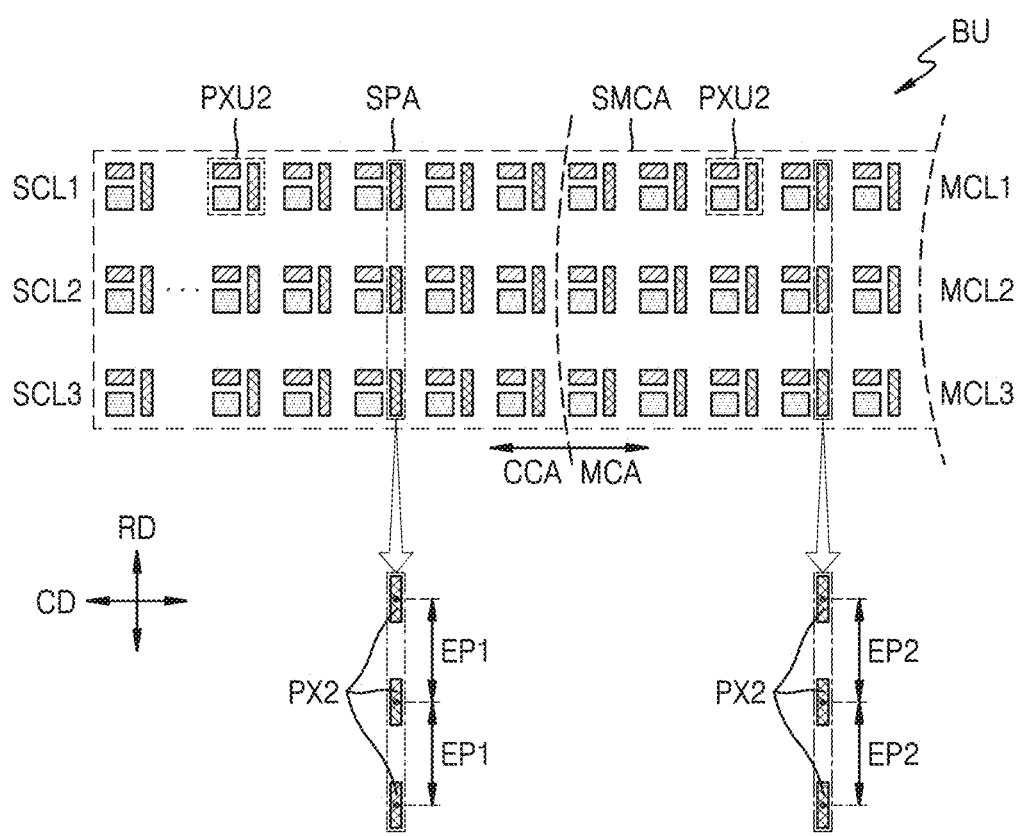
FIGS. 9A, 9B and 9C are each a schematic view of a basic unit of FIG. 6.
Figure 9B:
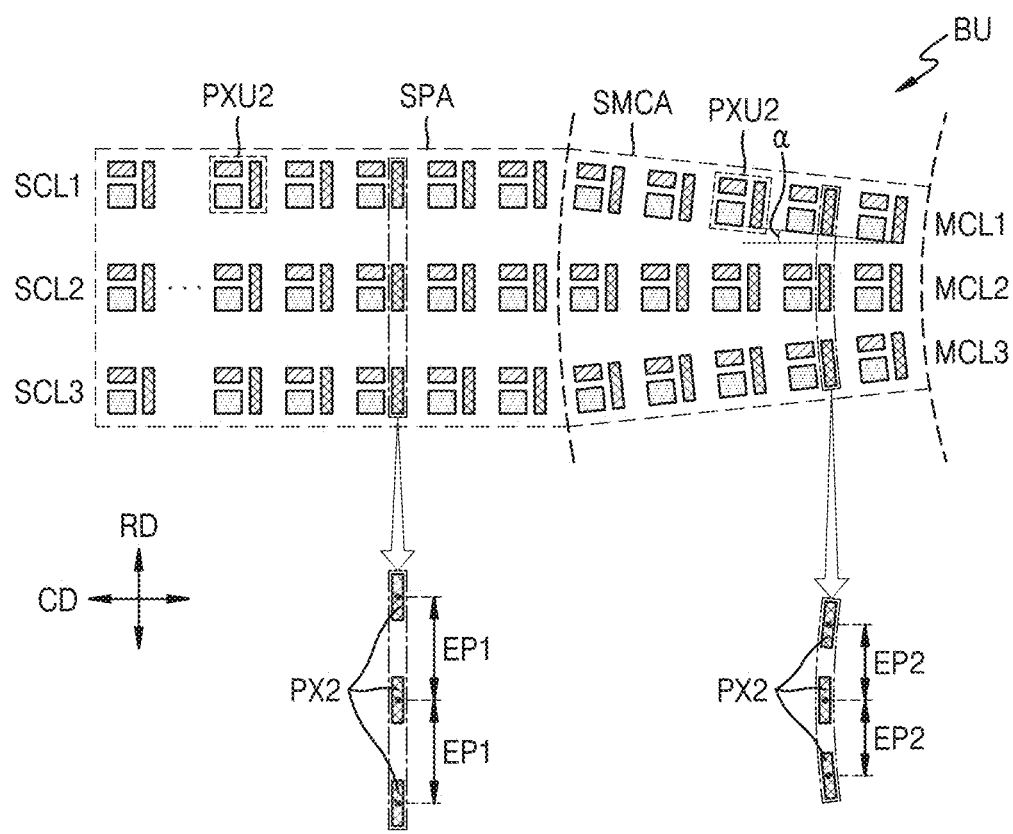
Figure 9C:
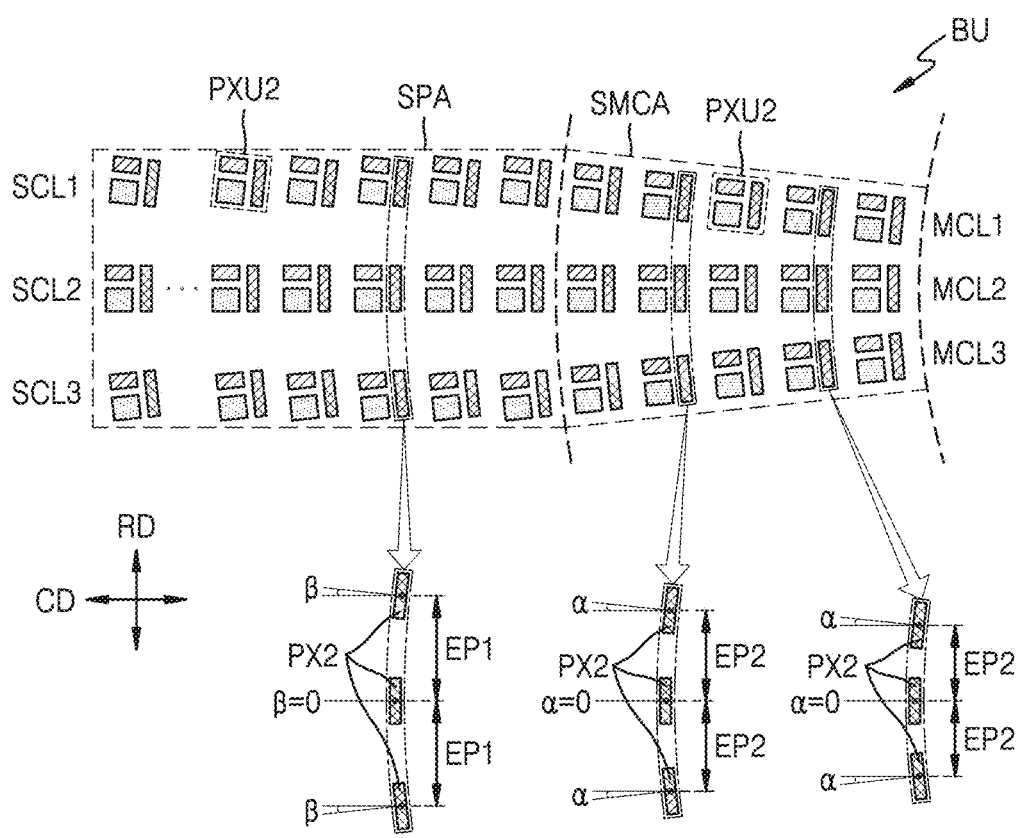

FIG. 6 is an enlarged view of a region E of the display panel 10 of FIG. 3. FIGS. 7A and 7B are enlarged views of a region F, which is a portion of the region E of FIG. 6. FIGS. 8A and 8B are each an example view of a configuration of a second pixel unit PXU2. FIGS. 9A, 9B and 9C are each a schematic view of a basic unit BU of FIG. 6.

Referring to FIG. 6, the plurality of pixels PX may be arranged in the center area CA, the first area A1, the second area A2, and the corner area CNA. Accordingly, the display panel 10 may display an image in the center area CA, the first area A1, the second area A2, and the corner area CNA. In the present specification, a pixel arrangement structure will be described based on an emission area of each pixel.

Referring to FIG. 6, the plurality of pixels PX may be arranged in the first display area DA1 and the second display area DA2. An arrangement structure of the pixels PX in the corner area CNA may be the same as or different from an arrangement structure of the pixels PX in the first display area DA1.

In the middle area MCA, the pixels PX may be arranged in a direction away from the center area CA. A driving circuit DC may be arranged in the middle area MCA. The driving circuit DC may include a plurality of sub-driving circuits. The plurality of sub-driving circuits may be arranged along a boundary between the middle area MCA and the first display area DA1. The plurality of sub-driving circuits may be arranged to at least partially surround the center area CA, the first area A1, and the second area A2. The plurality of pixels PX may be arranged in the middle area MCA. The plurality of pixels PX may overlap the plurality of sub-driving circuits in a plan view.

The central corner area CCA may include a stripe area SPA having a straight-line shape. In an embodiment, the central corner area CCA may include a plurality of stripe areas SPA that are apart from each other. Each of the plurality of stripe areas SPA may be an extension area that extends in a direction starting from a boundary between the middle area MCA and the central corner area CCA and away from the center area CA (hereinafter, referred to as an 'extension direction of a stripe area SPA'). In an embodiment, each of the plurality of stripe areas SPA may extend in a predetermined direction between the first direction (i.e., x direction) and the second direction (i.e., y direction).

A space area SA may be defined between an adjacent pair of stripe areas SPA. The space area SA may be an empty space in which components of the display panel 10 are not arranged. When the central corner area CCA is bent, compressive strain occurring in the central corner area CCA may be greater than tensile strain occurring in the central corner area CCA. In the present embodiment, because the space area SA may be defined between the adjacent stripes areas SPA, the central corner area CCA may contract. Accordingly, the display panel 10 may be bent at the central corner area CCA without being damaged.

The plurality of pixels PX may be arranged in a plurality of columns in each stripe area SPA. A column of the stripe area SPA may denote a line in the extension direction of the stripe area SPA within the stripe area SPA. The columns in the stripe area SPA may be parallel to each other. Distances between adjacent columns in the stripe area SPA may be the same. By arranging the pixels PX in two or more columns in the stripe area SPA, a resolution (the number of pixels per inch) of the corner area CNA may be increased. Accordingly, by reducing a difference in resolution between the first display area DA1 and the second display area DA2, a phenomenon in which the first display area DA1 and the second display area DA2 are visually distinguished from each other may be effectively minimized.

The plurality of pixels PX may include a plurality of first pixels PX1, a plurality of second pixels PX2, and a plurality of third pixels PX3. In an embodiment, the first pixel PX1 may be a red pixel, the second pixel PX2 may be a green pixel, and the third pixel PX3 may be a blue pixel.

First pixel units PXU1 may be arranged in the first display area DA1, and second pixel units PXU2 may be arranged in the second display area DA2 and the corner area CNA. A pixel unit (e.g., PXU1, PXU2) may be defined as a pixel set in which the plurality of pixels PX arranged according to a pixel arrangement structure are grouped into a preset unit. In an embodiment, the pixel unit may be a pixel set in a minimum unit that is repeated in a predetermined pixel arrangement structure.

In the first display area DA1, the plurality of pixels PX may be arranged in a pentile matrix structure or a pentile structure. In the pentile structure, high resolution may be realized with a small number of pixels by applying a rendering driving of expressing colors by sharing adjacent pixels.

As shown in FIG. 7A, in the first display area DA1, the first pixel PX1 and the third pixel PX3 may be alternately arranged in a first sub-row SR1 of each row Ri in the first direction, and the second pixel PX2 may be repeatedly arranged in a second sub-row SR2. Accordingly, in each row Ri, the pixels PX may be repeatedly arranged in an order of the first pixel PX1, the second pixel PX2, the third pixel PX3, and the second pixel PX2 in the first direction. Also, a first column C1 in which the first pixel PX1 and the third pixel PX3 are alternately arranged and a second column C2 in which the second pixel PX2 is repeatedly arranged may be alternately arranged in the first direction.

In the first display area DA1, the pixels PX may constitute the first pixel unit PXU1. In the first display area DA1 having a pentile structure, the first pixel unit PXU1 may be a pixel set including one first pixel PX1, one third pixel PX3, and two second pixels PX2. In the first display area DA1, the first pixel unit PXU1 may be repeatedly arranged in the first direction and the second direction.

In FIG. 7A, the plurality of pixels PX are arranged in a pentile structure in the first display area DA1, but the disclosure is not limited thereto. For example, the plurality of pixels PX may be arranged in various shapes, such as a stripe structure, a mosaic structure, and a delta structure.

In an embodiment, the pixels PX may be arranged in an S-stripe structure (i.e., three-pixel arrangement shown in FIG. 8A) in the corner area CNA. The second pixel PX2 may be repeatedly arranged along a first virtual line IL1, and the first pixel PX1 and the third pixel PX3 may be alternately arranged along a second virtual line IL2. In this case, the first pixel PX1 and the third pixel PX3 may have a quadrangular shape having a long side in a direction perpendicular to the second virtual line IL2, and the second pixel PX2 may have a quadrangular shape having a long side in an extension direction of the first virtual line IL1. A length of the second pixel PX2 in the extension direction of the first virtual line IL1 may be equal to or greater than the sum of a length of the first pixel PX1 in an extension direction of the second virtual line IL2 and a length of the third pixel PX3 in the extension direction of the second virtual line IL2. The first virtual line IL1 and the second virtual line IL2 may be virtual lines extending along the boundary between the middle area MCA and the first display area DA1.

In the corner area CNA, the pixels PX may constitute the second pixel unit PXU2. In the corner area CNA having an S-stripe structure, the second pixel unit PXU2 may be a pixel set including one first pixel PX1, one second pixel PX3, and one third pixel PX3. In the corner area CNA, the second pixel unit PXU2 may be repeatedly arranged in a predetermined direction.

As shown in FIG. 7A, a size of each of the first pixel PX1, the second pixel PX2, and the third pixel PX3 in the second display area DA2 (the corner area CNA) may be greater than a size of each of the first pixel PX1, the second pixel PX2, and the third pixel PX3 in the first display area DA1. A size of the second pixel unit PXU2 may be greater than a size of the first pixel unit PXU1.

In another embodiment, the size of each of the first pixel PX1, the second pixel PX2, and the third pixel PX3 in the second display area DA2 (the corner area CNA) may be equal to or less than the size of each of the first pixel PX1, the second pixel PX2, and the third pixel PX3 in the first display area DA1.

In FIG. 7A, the second pixel PX2 among the pixels constituting the second pixel unit PXU2 is arranged close to a boundary between the first display area DA1 and the second display area DA2, but embodiments of the disclosure are not limited thereto. As shown in FIG. 7B, the first pixel PX1 and the third pixel PX3 among the pixels constituting the second pixel unit PXU2 may be arranged close to the boundary between the first display area DA1 and the second display area DA2.

In an embodiment, as shown in FIG. 8A, the pixels constituting the second pixel unit PXU2 may be arranged such that the first pixel PX1 and the second pixel PX2 have a quadrangular shape having a long side in the direction perpendicular to the second virtual line IL2, and the third pixel PX3 has a quadrangular shape having a long side in the extension direction of the first virtual line IL1. Alternatively, as shown in FIG. 8B, the pixels constituting the second pixel unit PXU2 may be arranged such that the second pixel PX2 and the third pixel PX3 have a quadrangular shape having a long side in the direction perpendicular to the second virtual line IL2, and the first pixel PX1 has a quadrangular shape having a long side in the extension direction of the first virtual line IL1. The second pixel unit PXU2 illustrated in FIGS. 8A and 8B may be arranged in the corner area CNA as illustrated in FIG. 7A or 7B.

Referring back to FIG. 6, the pixels PX arranged in the middle area MCA and the central corner area CCA may be divided into a basic unit BU. The basic unit BU is a division unit of repetitive shapes of an arrangement of the pixels PX in the corner area CNA, and does not indicate disconnection of components. In an embodiment, the basic unit BU may include one stripe area SPA of the central corner area CCA and a partial area (hereinafter, referred to as a "sub-area SMCA") of the middle area MCA corresponding thereto. That is, the middle area MCA may include a plurality of sub-areas SMCA corresponding to the plurality of stripe areas SPA, respectively.

As shown in FIGS. 9A to 9C, a first column SCL1, a second column SCL2, and a third column SCL3 of the stripe area SPA may correspond to a first column MCL1, a second column MCL2, and a third column MCL3 of the corresponding sub-area SMCA, respectively. The second pixel units PXU2 may be arranged in each of the first column SCL1, the second column SCL2, and the third column SCL3 of the stripe area SPA, and the first column MCL1, the second column MCL2, and the third column MCL3 of the sub-area SMCA. The number of the second pixel units PXU2 arranged in each of the first column SCL1, the second column SCL2, and the third column SCL3 of the stripe area SPA may be determined according to a corner shape. As used herein, the "column" in the stripe area SPA and the sub-area SMCA are defined as a line in the extension direction of the stripe area SPA (i.e., fourth direction CD), different from the columns C1 and C2 in FIGS. 7A and 7B.

In an embodiment, as shown in FIG. 9A, the basic unit BU may include the stripe area SPA and the sub-area SMCA each having a straight-line shape. The plurality of columns of each of the stripe area SPA and the sub-area SMCA may be parallel to each other. An emission pitch EP1 of pixels arranged adjacent to each other in a fifth direction RD in the stripe area SPA may be the same as an emission pitch EP2 of pixels arranged adjacent to each other in the fifth direction RD in the sub-area SMCA. Here, an emission pitch may be a pixel pitch of pixels for emitting light of the same color, and the fifth direction RD is substantially perpendicular to the fourth direction CD, which is an extension direction of the stripe area SPA. For example, the emission pitch EP1 of the second pixels PX2 arranged adjacent to each other in the fifth direction RD in the stripe area SPA may be the same as the emission pitch EP2 of the second pixels PX2 arranged adjacent to each other in the fifth direction RD in the sub-area SMCA.

In another embodiment, as shown in FIG. 9B, the basic unit BU may include the stripe area SPA having a straight-line shape and the sub-area SMCA having a radial shape. The plurality of columns (e.g., SCL1 to SCL3) of the stripe area SPA may be parallel to each other, and the plurality of columns (e.g., MCL1 to MCL3) of the sub-area SMCA may have an increasing distance therebetween as the columns radially away from the center area CA. The emission pitches EP1 of the pixels arranged adjacent to each other in the fifth direction RD in the stripe area SPA may be the same regardless of the location of the pixels in the fourth direction CD. Although the emission pitches EP2 of the pixels arranged adjacent to each other in the fifth direction RD in the sub-area SMCA are the same, the emission pitch EP2 may increase in a direction away from the center area CA. For example, the emission pitches EP1 of the second pixels PX2 arranged adjacent to each other in the fifth direction RD in the stripe area SPA may be the same regardless of the location of the second pixels PX2 in the fourth direction CD. The emission pitches EP2 of the second pixels PX2 arranged adjacent to each other in the fifth direction RD in the sub-area SMCA may be the same, and the emission pitch EP2 may increase in the fourth direction CD. In addition, the pixels arranged in each column of the sub-area SMCA may be rotated by a radiation angle $\alpha$, which is an angle between a radiation direction of each column of the sub-area SMCA and the fourth direction CD.

In still another embodiment shown in FIG. 9C, some pixels in the stripe area SPA having a straight-line shape are rotated by a predetermined angle, as compared with pixels in the stripe area SPA of FIGS. 9A and 9B. Pixels arranged in each column of the stripe area SPA may be rotated by a rotation angle $\beta$, which corresponds to a radiation angle $\alpha$ of a corresponding column of the sub-area SMCA.

In an embodiment, a pixel arranged in a column having a radiation angle $\alpha$ of 0 degree in the middle area MCA may be defined as a reference pixel. For example, in FIG. 9C, when the second column MCL2 of the sub-area SMCA is a column having a radiation angle $\alpha$ of 0 degree, first to third pixels arranged in the second column MCL2 may be defined as first to third reference pixels.

In an embodiment, as shown in FIGS. 9A and 9B, pixels arranged in each of the plurality of columns in the stripe area SPA may be arranged in the same manner as a reference pixel. In an embodiment, as shown in FIG. 9C, the pixels arranged in each of the plurality of columns in the stripe area SPA may be rotated by the radiation angle $\alpha$ of the corresponding column of the corresponding sub-area SMCA with respect to a reference pixel.

In FIG. 9C, a radiation angle α of each of the first column MCL1, the second column MCL2, and the third column MCL3 of the sub-area SMCA may be the same as a rotation angle β of pixels in the corresponding column of the first column SCL1, the second column SCL2, and the third column SCL3 of the stripe area SPA. For example, a radiation angle α of the first column MCL1 of the sub-area SMCA and a rotation angle β of pixels arranged in the first column SCL1 of the stripe area SPA may have the same predetermined value. A radiation angle α of the second column MCL2 of the sub-area SMCA and a rotation angle β of pixels arranged in the second column SCL2 of the stripe area SPA may have the same value of 0 degree. A radiation angle α of the third column MCL3 of the sub-area SMCA and a rotation angle β of pixels arranged in the third column SCL3 of the stripe area SPA may have the same predetermined value.

Figure 10:
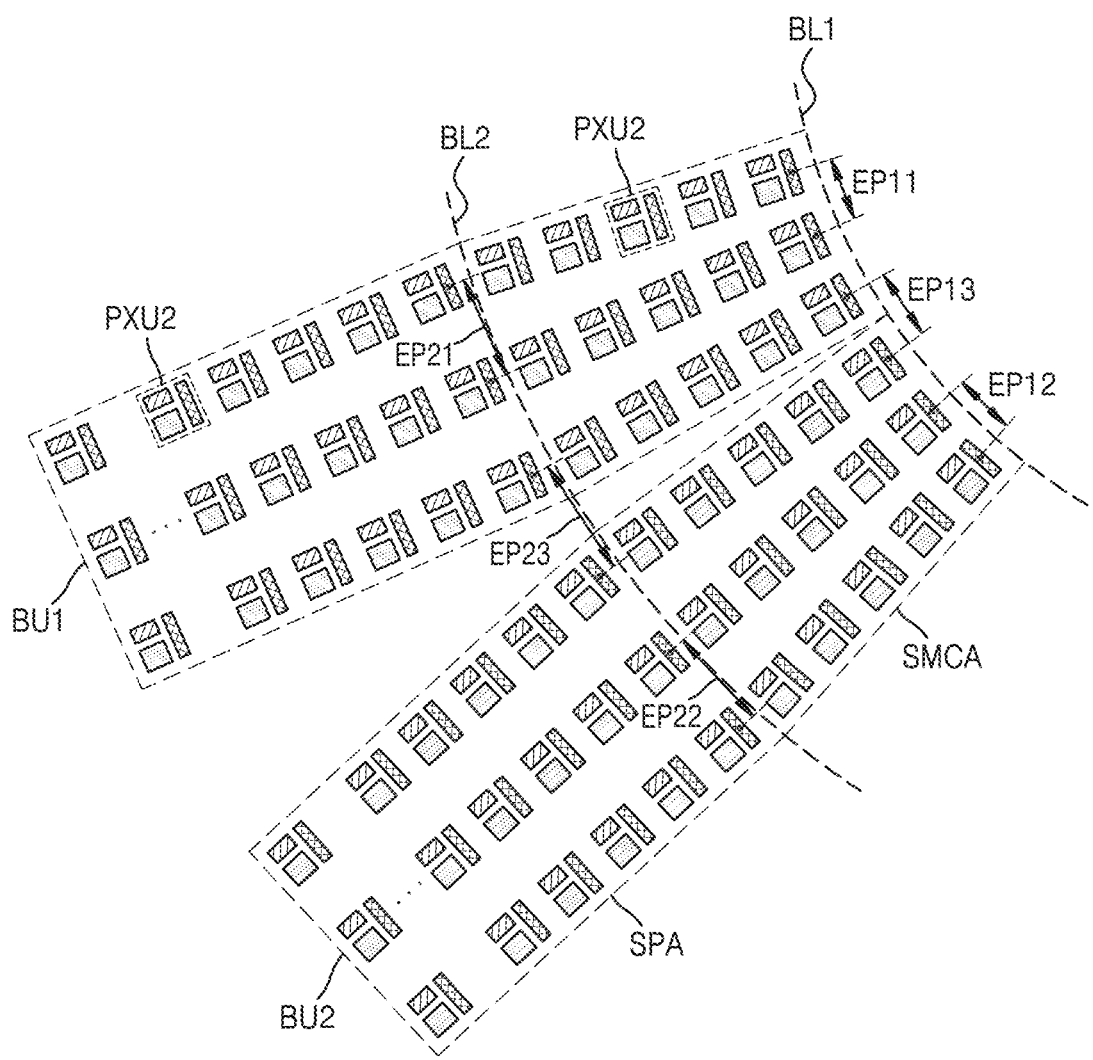
FIG. 10 is a schematic view of an arrangement of two basic units in a state in which a display panel is unbent.
Figure 11:
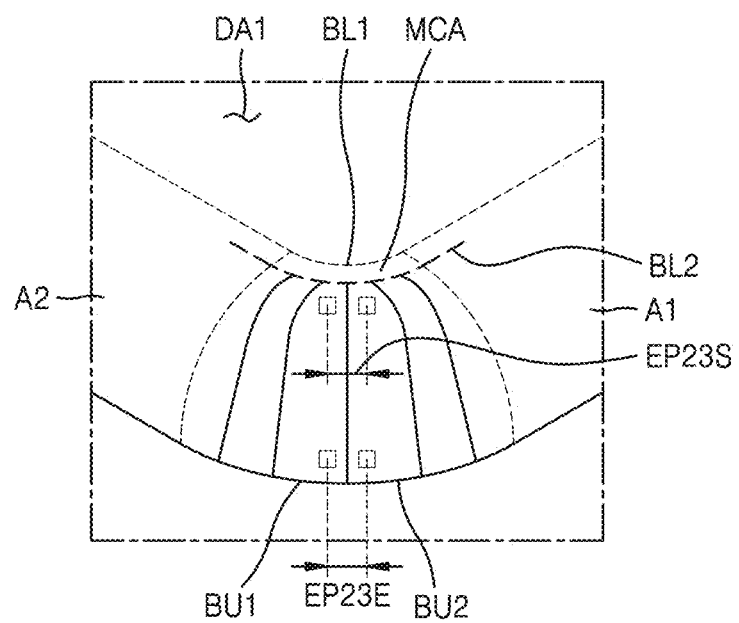
FIG. 11 is a schematic view of a corner area in a state in which a display panel is bent.

FIG. 10 is a schematic view of an arrangement of two basic units in a state in which the display panel 10 is unbent. FIG. 11 is a schematic view of the corner area CNA in a state in which the display panel 10 is bent.

Referring to FIG. 10, in the corner area CNA, a first basic unit BU1 and a second basic unit BU2 may be arranged along a boundary line BL1 between the middle area MCA and the first display area DA1. A curvature of the boundary line BL1 may correspond to a curvature of the corner area CNA.

An emission pitch (e.g., EP11, EP12) of pixels adjacent to the boundary line BL1 in the basic unit BU1 and BU2 may be the same as an emission pitch (e.g., EP13) of pixels adjacent to a boundary line between the basic units BU1 and BU2. For example, an emission pitch EP11 between the second pixels PX2 of the first basic unit BU1, an emission pitch EP12 between the second pixels PX2 of the second basic unit BU2, and an emission pitch EP13 between the second pixel PX2 of the first basic unit BU1 and the second pixel PX2 of the second basic unit BU2 that are adjacent to each other may be the same. Here, the second pixels PX2 may be adjacent to the boundary line BL1.

An emission pitch of pixels adjacent to an area where the stripe area SPA starts within the basic unit, that is, a boundary line BL2 between the middle area MCA and the central corner area CCA, may be the same as an emission pitch of pixels adjacent to the boundary line between the stripe areas SPA. For example, an emission pitch EP21 between the second pixels PX2 of the first basic unit BU1, an emission pitch EP22 between the second pixels PX2 of the second basic unit BU2, and an emission pitch EP23 between the second pixel PX2 of the first basic unit BU1 and the second pixel PX2 of the second basic unit BU2 that are adjacent to each other may be the same, where the second pixels PX2 may be adjacent to the boundary line BL2.

An emission pitch of pixels arranged at an end of the stripe area SPA may be determined based on a state when the stripe areas SPA adjacent to each other are bent and adhered to each other. For example, in a state in which the stripe areas SPA adjacent to each other are bent, the emission pitches of the pixels PX in the stripe areas SPA adjacent to each other, arranged adjacent to an end thereof may be the same, in the stripe areas SPA adjacent to each other, and between those stripe areas SPA. For example, as shown in FIG. 11, when the stripe areas SPA are bent and adhered to each other, an emission pitch EP23E between the second pixel PX2 of the first basic unit BU1 and the second pixel PX2 of the second basic unit BU2 that are arranged at the end of the stripe area SPA and adjacent to each other may be the same as an emission pitch EP23S between the second pixel PX2 of the first basic unit BU1 and the second pixel PX2 of the second basic unit BU2 that are adjacent to the boundary line BL2 and adjacent to each other.

FIGS. 12A to 14C are views of various examples of the basic unit BU according to embodiments.

Figure 12A:
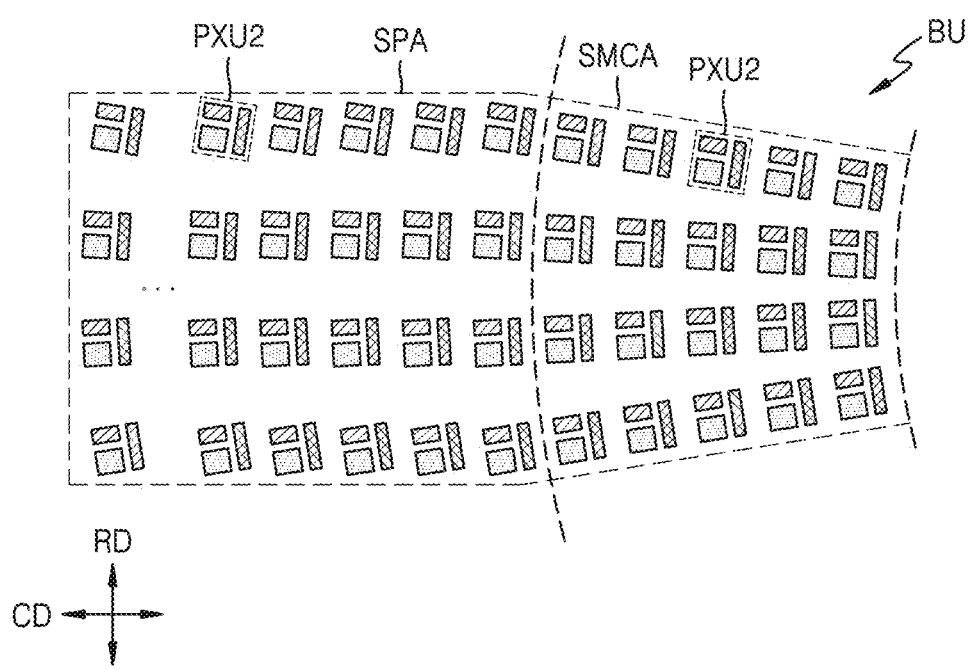
FIGS. 12A to 14C are views of various examples of a basic unit according to embodiments.
Figure 12B:
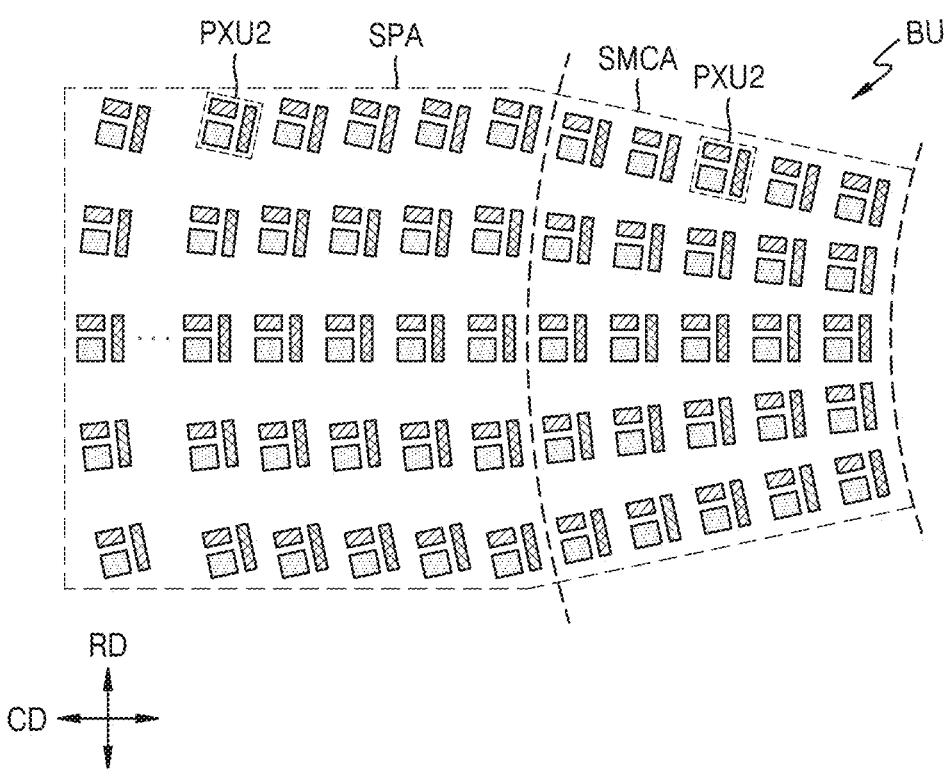
Figure 12C:
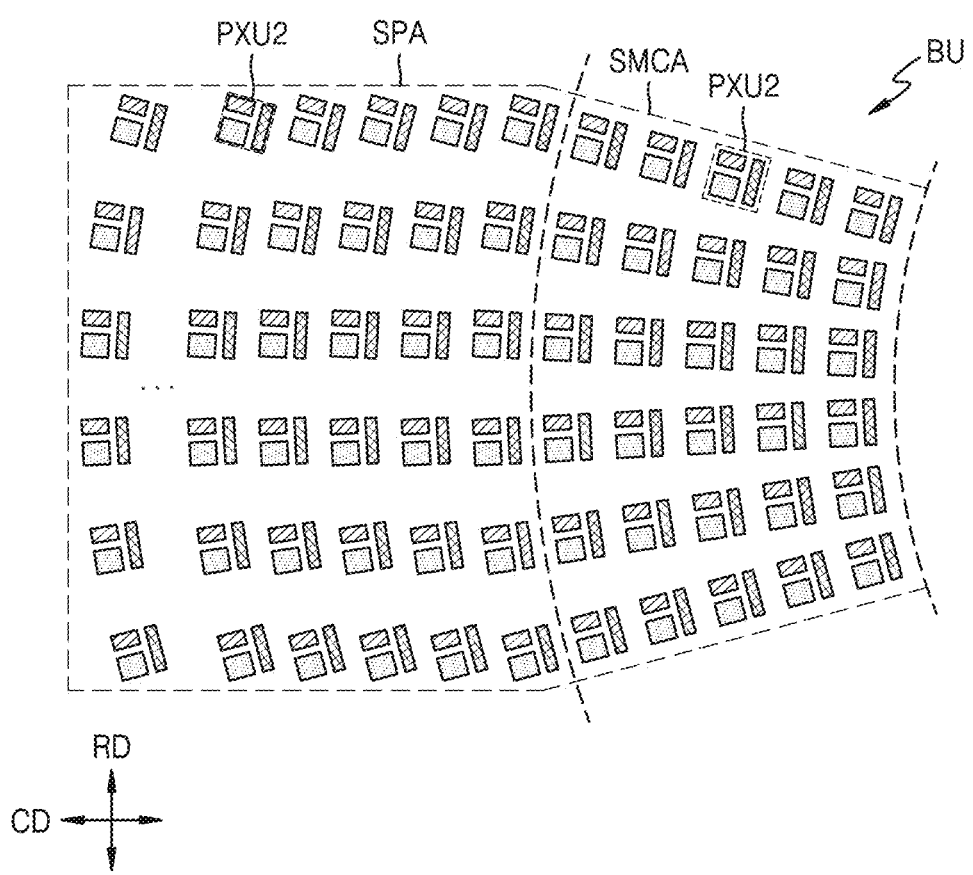

In the embodiments shown in FIGS. 6 to 10, the basic unit BU includes three columns. However, this is an example, and the basic unit BU may include two or more columns. For example, as shown in FIGS. 12A to 12C, the basic unit BU may include four columns, five columns, or six columns.

Figure 13A:
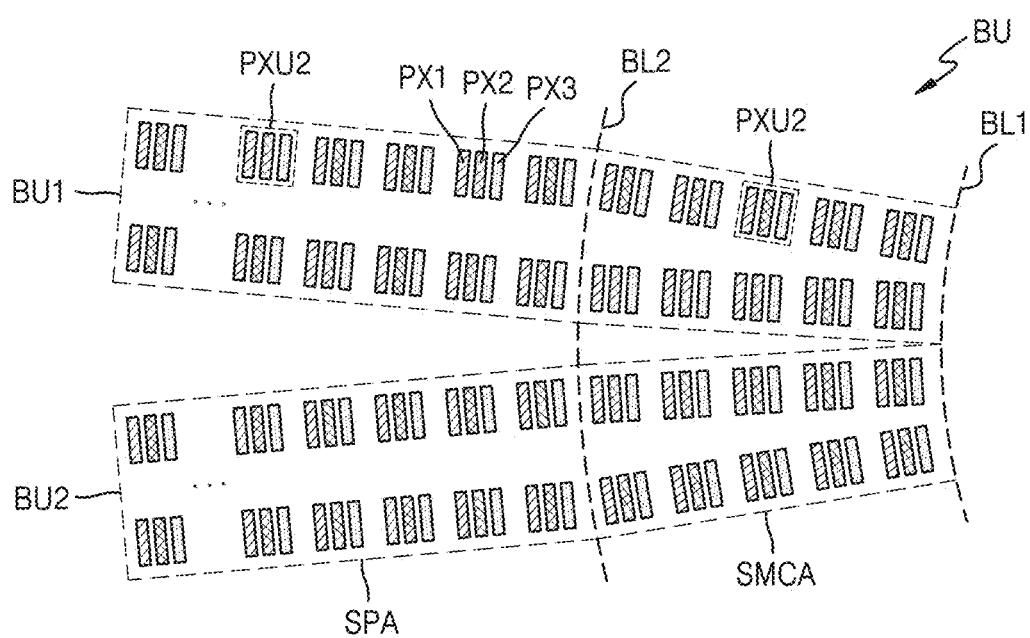
Figure 13B:
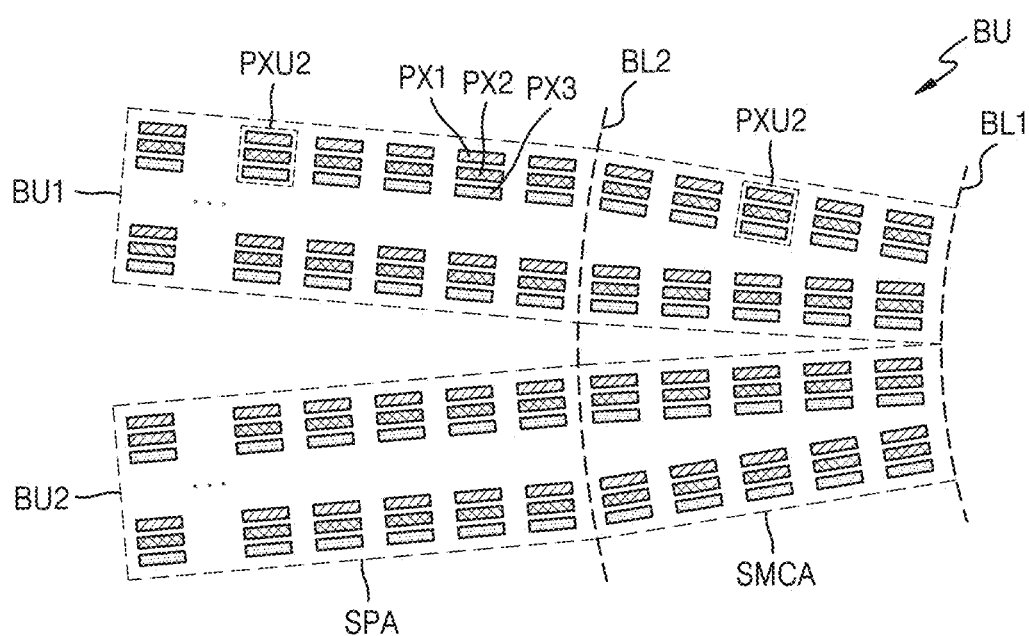
Figure 13C:
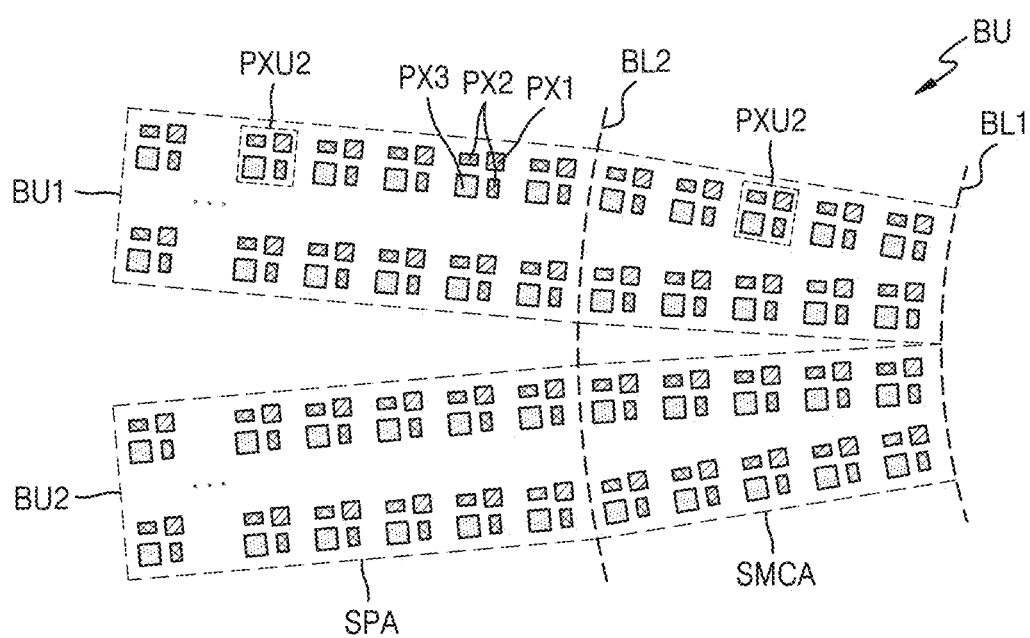

In the embodiments shown in FIGS. 6 to 10, a pixel arrangement structure of the basic unit BU has an S-stripe structure. However, this is an example, and the pixel arrangement structure of the basic unit BU may have various structure, such as a pentile structure, a stripe structure, a mosaic structure, and a delta structure. For example, as shown in FIGS. 13A and 13B, the pixel arrangement structure of the basic unit BU may have a stripe structure. The stripe structure may have a structure in which the first pixel PX1, the second pixel PX2, and the third pixel PX3 are arranged side by side in a predetermined direction. A direction of a long side of each of the first pixel PX1, the second pixel PX2, and the third pixel PX3 may be the extension direction of the stripe area SPA, as shown in FIG. 13B, or may be a direction perpendicular to the extension direction of the stripe area SPA, as shown in FIG. 13A. Alternatively, as shown in FIG. 13C, the pixel arrangement structure of the basic unit BU may have a pentile structure.

The embodiments shown in FIGS. 6 to 10 has an S-stripe structure in which an arrangement of the first to third pixels PX1 to PX3 arranged in each column of the basic unit BU is the same. However, this is an example, and the arrangement of the first to third pixels PX1 to PX3 arranged in each column of the basic unit BU may be different.

Figure 14A:
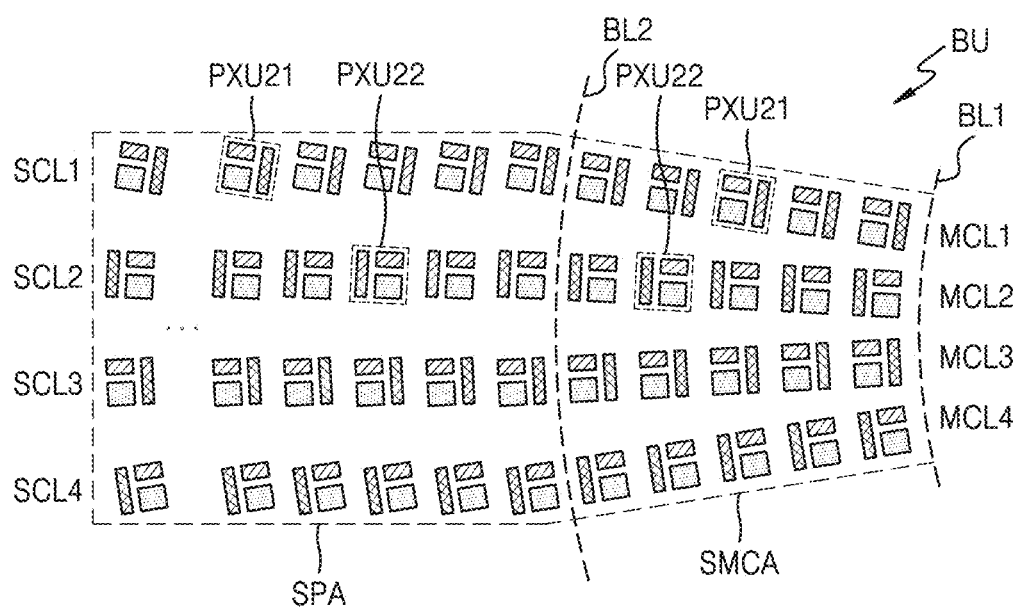

In an embodiment, as shown in FIG. 14A, the basic unit BU may include four columns, and the pixel arrangement structure thereof may have an S-stripe structure. Also, a 2-1st pixel unit PXU21 in which the second pixel PX2 is arranged closer to the boundary line BL1 than the first pixel PX1 and the third pixel PX3 may be arranged in odd-numbered columns MCL1/SCL1 and MCL3/SCL3 of the basic unit BU, and a 2-2nd pixel unit PXU22 in which the first pixel PX1 and the third pixel PX3 are arranged closer to the boundary line BL1 than the second pixel PX2 may be arranged in even-numbered columns MCL2/SCL2 and MCL4/SCL4 of the basic unit BU.

Figure 14B:
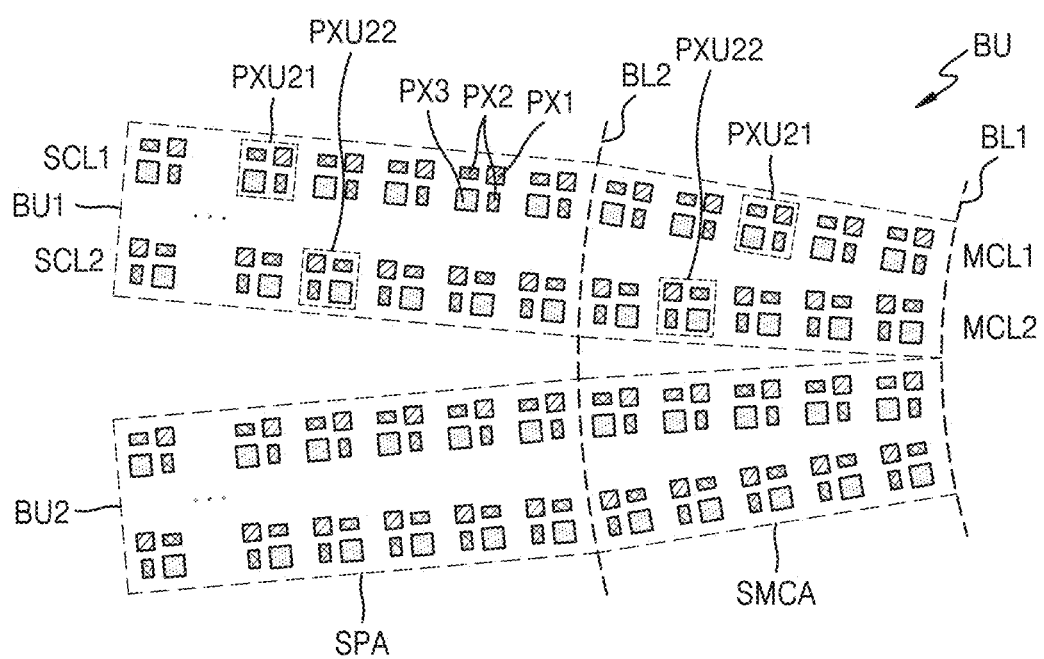

In an embodiment, as shown in FIG. 14B, the basic unit BU may include two columns, and the pixel arrangement structure thereof may have a pentile structure. Also, an arrangement of the first to third pixels PX1 to PX3 constituting the 2-1st pixel unit PXU21 arranged in the odd-numbered column MCL1/SCL1 of the basic unit BU may be different from an arrangement of the first to third pixels PX1 to PX3 constituting the 2-2nd pixel unit PXU22 arranged in the even-numbered column MCL2/SCL2 of the basic unit BU.

Figure 14C:
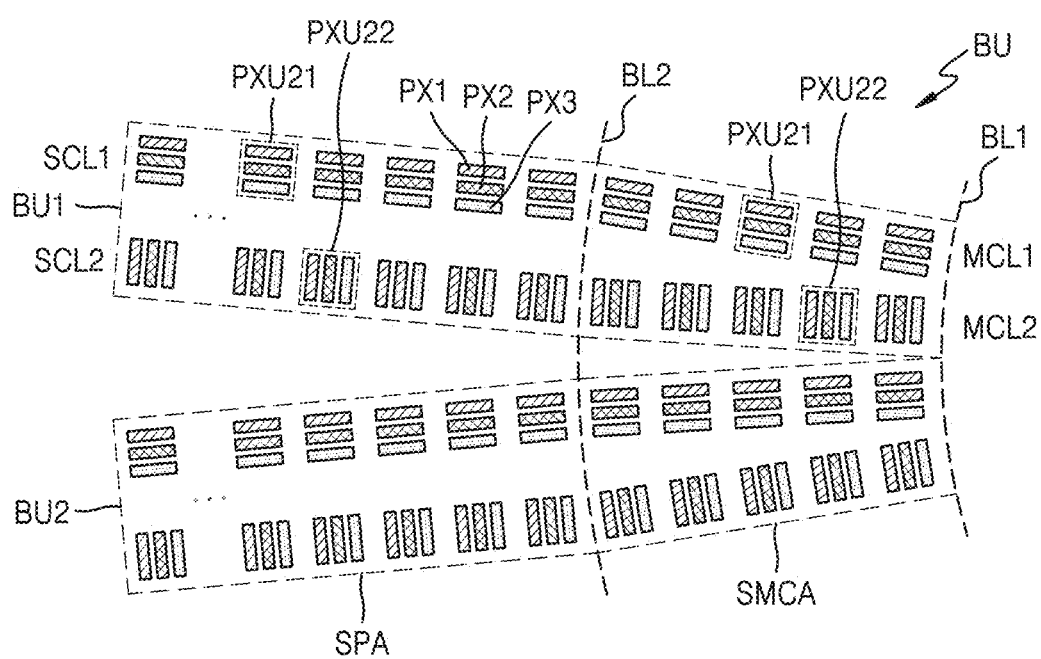

In an embodiment, as shown in FIG. 14C, the basic unit BU may include two columns, and the pixel arrangement structure thereof may have a stripe structure. Also, a long-side arrangement direction of the first to third pixels PX1 to PX3 constituting the 2-1st pixel unit PXU21 arranged in the odd-numbered column MCL1/SCL1 of the basic unit BU may be different from a long-side arrangement direction of the first to third pixels PX1 to PX3 constituting the 2-2nd pixel unit PXU22 arranged in the even-numbered column MCL2/SCL2 of the basic unit BU.

Figure 15:
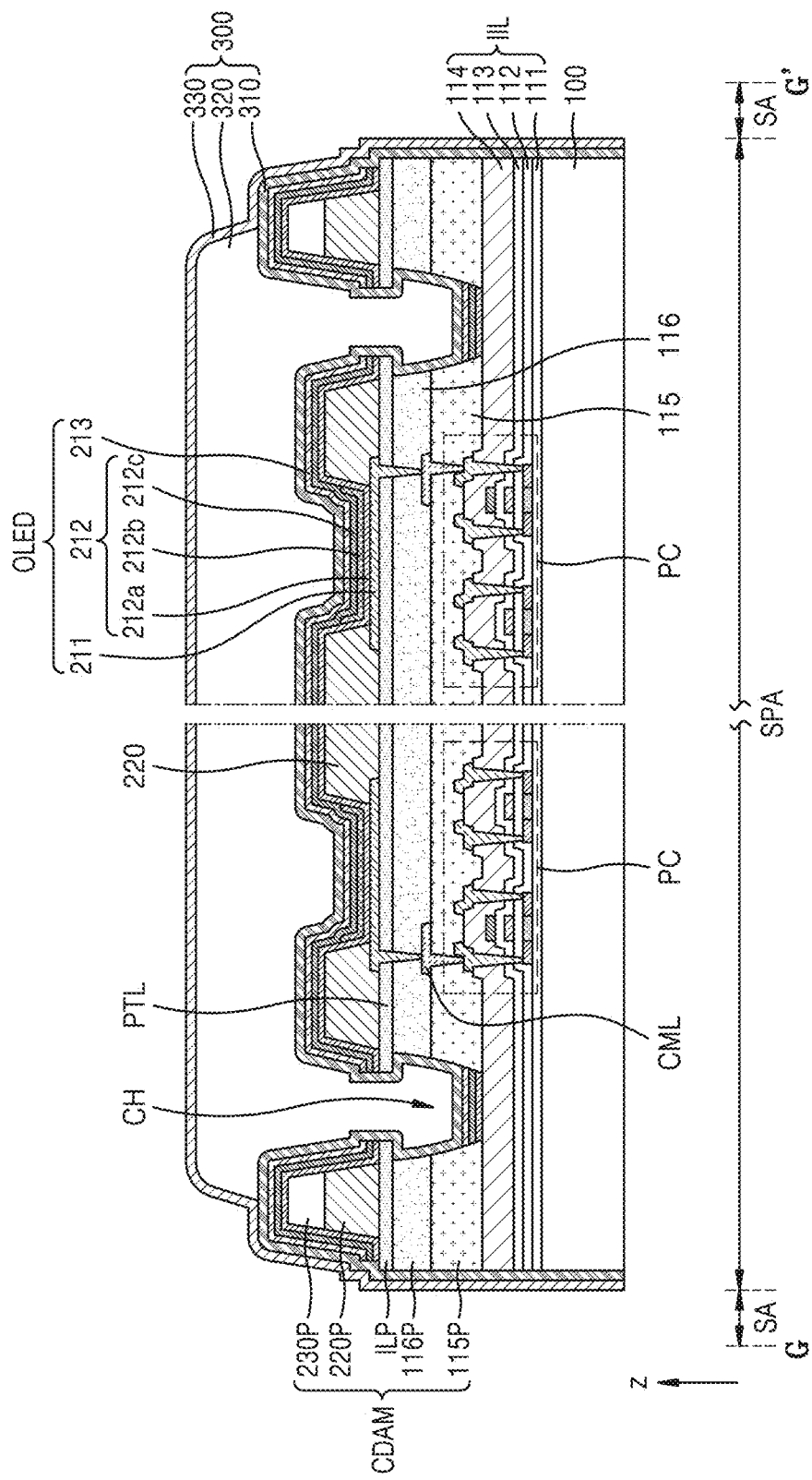
FIG. 15 is a schematic cross-sectional view of a stripe area of FIG. 6, taken along line G-G'.
Figure 16:
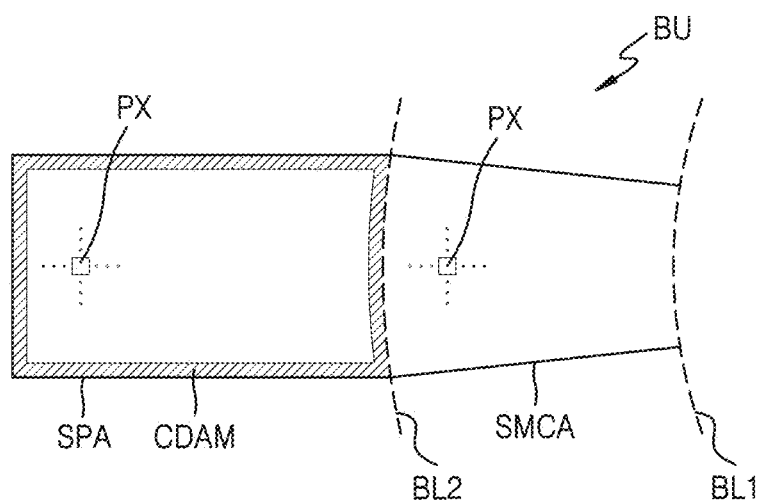
FIG. 16 is a schematic view of a basic unit in which a corner dam of the stripe area of FIG. 15 is shown.

FIG. 15 is a schematic cross-sectional view of the stripe area SPA of FIG. 6, taken along line G-G'. FIG. 16 is a schematic view of the basic unit BU in which a corner dam CDAM of the stripe area SPA of FIG. 15 is shown. In FIG. 15, the same reference numerals as those in FIG. 5 denote the same members, and thus, redundant descriptions thereof will be omitted.

Referring to FIG. 15, in the stripe area SPA, a pixel including the pixel circuit PC and the organic light-emitting diode OLED, which is a display element, connected to the pixel circuit PC may be arranged on the substrate 100. A pattern layer PTL may be arranged on the second insulating layer 116, and the pixel electrode 211 and the pixel-defining layer 220 may be sequentially arranged on the pattern layer PTL. The pixel electrode 211 may be electrically connected to the connection electrode CML through holes of the pattern layer PTL and the second insulating layer 116. In an embodiment, the pattern layer PTL may be an inorganic layer. Other components of the pixel circuit PC and the organic light-emitting diode OLED are the same as those of the pixel circuit PC and the organic light-emitting diode OLED shown in FIG. 5, and thus, descriptions thereof will be omitted. A spacer may be omitted in the stripe area SPA.

As shown in FIG. 16, the corner dam CDAM may be arranged along an edge of the stripe area SPA. A corner hole CH may be formed between the pixel PX and the corner dam CDAM along the corner dam CDAM in the first insulating layer 115 and the second insulating layer 116. The corner dam CDAM may have a multi-layered structure including a plurality of layers. The corner dam CDAM may include a first layer 115P, a second layer 116P, a third layer ILP, a fourth layer 220P, and a fifth layer 230P that are sequentially stacked in the third direction (the z direction). The first layer 115P may be formed of the same material as and simultaneously with the first insulating layer 115. The second layer 116P may be formed of the same material as and simultaneously with the second insulating layer 116. The third layer ILP may be formed of the same material as and simultaneously with the pattern layer PTL. The fourth layer 220P may be formed of the same material as and simultaneously with the pixel-defining layer 220. The fifth layer 230P may be formed of the same material as and simultaneously with the spacer 230. Although the spacer 230 is not arranged on the pixel-defining layer 220 in FIG. 15, the spacer 230 may be arranged on the pixel-defining layer 220 in another embodiment.

The first functional layer 212a, the second functional layer 212c, and the opposite electrode 213 of the organic light-emitting diode OLED may extend to a portion exposed by the corner hole CH and an upper portion of the corner dam CDAM.

The encapsulation layer 300 may be arranged on the organic light-emitting diode OLED and the corner dam CDAM. The encapsulation layer 300 may include a first inorganic encapsulation layer 310, the organic encapsulation layer 320, and a second inorganic encapsulation layer 330. The first inorganic encapsulation layer 310 and the second inorganic encapsulation layer 330 may cover the corner dam CDAM, and may also cover a side surface of the corner dam CDAM. A position of the organic encapsulation layer 320 may be limited by the corner dam CDAM.

According to embodiments of the disclosure, a display panel and a display apparatus having improved reliability. Luminance non-uniformity between a main display area and a corner area may be minimized, may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate comprising a first display area and a second display area; and
a plurality of pixels arranged in the first display area and the second display area of the substrate,
wherein the first display area comprises a center area having a planar shape, a first area adjacent to the center area in a first direction, and a second area adjacent to the center area in a second direction crossing the first direction, and
the second display area comprises a corner area between the first area and the second area,
wherein the corner area comprises:
a middle area adjacent to the first display area; and
a plurality of extension areas extending from the middle area in a direction away from the middle area,
wherein the plurality of extension areas each have a straight-line shape, the plurality of extension areas are apart from each other,
the middle area comprises a plurality of sub-areas corresponding to the plurality of extension areas, respectively, and
the plurality of sub-areas each have a radial shape,
wherein a pixel unit is arranged along a plurality of columns parallel to each other in each of the plurality of extension areas, the pixel unit is a sub set of the plurality of pixels, and
the pixel unit is arranged along a plurality of columns each having a radial shape in each of the plurality of sub-areas.

2. The display panel of claim 1, wherein a pixel arranged in a column having a radiation angle of 0 degree among the plurality of columns in the middle area is a reference pixel among the plurality of pixels, and
pixels arranged in each of the plurality of columns of each extension area are arranged in a same manner as the reference pixel.

3. The display panel of claim 1, wherein a pixel arranged in a column having a radiation angle of 0 degree among the plurality of columns in the middle area is a reference pixel among the plurality of pixels, and
pixels arranged in each of the plurality of columns of each extension area are rotated by a radiation angle of a corresponding column of a corresponding sub-area with respect to the reference pixel.

4. The display panel of claim 1, wherein a pixel arrangement structure of the pixels of the pixel unit is different from a pixel arrangement structure of the first display area.

5. The display panel of claim 1, wherein a pixel arrangement structure of the pixels of the pixel unit is the same as a pixel arrangement structure of the first display area.

6. The display panel of claim 1, wherein a pixel arrangement structure of the pixels of the pixel unit comprises a pentile structure, a stripe structure, or an S-stripe structure.

7. The display panel of claim 1, wherein the pixel unit comprises a first pixel, a second pixel, and a third pixel, which emit light of different colors, and the plurality of columns in each extension area comprises a first column and a second column in which the first to third pixels arranged in the pixel unit have different positions according to a pixel arrangement structure, and the first column and the second column are alternately arranged.

8. The display panel of claim 1, wherein the plurality of extension areas comprises a first extension area and a second extension area adjacent to each other, and the plurality of sub-areas comprise a first sub-area corresponding to the first extension area and a second sub-area corresponding to the second extension area, and in a state in which the first extension area and the second extension area are unbent, emission pitches of the pixels in the middle area, arranged adjacent to a boundary between the first display area and the middle area are the same in the first sub-area, in the second sub-area, and between the first sub-area and the second sub-area, and emission pitches of the pixels in the plurality of extension areas, arranged adjacent to a boundary between the middle area and the plurality of extension areas are the same in the first extension area, in the second extension area, and between the first extension area and the second extension area.

9. The display panel of claim 8, wherein, in a state in which the first extension area and the second extension area are bent, emission pitches of the pixels in the first extension area and the second extension area, arranged adjacent to an end of the first extension area and an end of the second extension area are the same in the first extension area, in the second extension area, and between the first extension area and the second extension area.

10. The display panel of claim 9, wherein, in the state in which the first extension area and the second extension area are bent, the emission pitches of the pixels arranged adjacent to the boundary between the middle area and the plurality of extension areas are the same as the emission pitches of the pixels arranged adjacent to the end of the first extension area and the end of the second extension area, in the first extension area, in the second extension area, and between the first extension area and the second extension area.

11. A display apparatus comprising:
a display panel; and
a cover window arranged on the display panel,
wherein the display panel comprises:
a substrate comprising a first display area and a second display area; and
a plurality of pixels arranged in the first display area and the second display area of the substrate,
wherein the first display area comprises a center area having a planar shape, a first area adjacent to the center area in a first direction, and a second area adjacent to the center area in a second direction crossing the first direction, and
the second display area comprises a corner area between the first area and the second area,
wherein the corner area comprises:
a middle area adjacent to the first display area; and
a plurality of extension areas extending from the middle area in a direction away from the middle area,
wherein the plurality of extension areas each have a straight-line shape, the plurality of extension areas are apart from each other,
the middle area comprises a plurality of sub-areas corresponding to the plurality of extension areas, respectively, and the plurality of sub-areas each have a radial shape,
wherein a pixel unit is arranged along a plurality of columns parallel to each other in each of the plurality of extension areas,
the pixel unit is a subset of the plurality of pixels, and
the pixel unit is arranged along a plurality of columns each having a radial shape in each of the plurality of sub-areas.

12. The display apparatus of claim 11, wherein a pixel arranged in a column having a radiation angle of 0 degree among the plurality of columns in the middle area is a reference pixel among the plurality of pixels, and pixels arranged in each of the plurality of columns of each extension area are arranged in a same manner as the reference pixel.

13. The display apparatus of claim 11, wherein a pixel arranged in a column having a radiation angle of 0 degree among the plurality of columns in the middle area is a reference pixel among the plurality of pixels, and pixels arranged in each of the plurality of columns of each extension area are rotated by a radiation angle of a corresponding column of a corresponding sub-area with respect to the reference pixel.

14. The display apparatus of claim 11, wherein a pixel arrangement structure of the pixels of the pixel unit is the same as or different from a pixel arrangement structure of the first display area, and the pixel arrangement structure of the pixels of the pixel unit comprises a pentile structure, a stripe structure, or an S-stripe structure.

15. The display apparatus of claim 11, wherein the pixel unit comprises a first pixel, a second pixel, and a third pixel, which emit light of different colors, and the plurality of columns in each extension area comprises a first column and a second column in which the first to third pixels arranged in the pixel unit have different positions according to a pixel arrangement structure, and the first column and the second column are alternately arranged.

16. The display apparatus of claim 11, wherein the plurality of extension areas comprises a first extension area and a second extension area adjacent to each other, and the plurality of sub-areas comprise a first sub-area corresponding to the first extension area and a second sub-area corresponding to the second extension area, and in a state in which the first extension area and the second extension area are unbent, emission pitches of the pixels in the middle area, arranged adjacent to a boundary between the first display area and the middle area are the same in the first sub-area, in the second sub-area, and between the first sub-area and the second sub-area, and emission pitches of the pixels in the plurality of extension areas, arranged adjacent to a boundary between the middle area and the plurality of extension areas are the same in the first extension area, in the second extension area, and between the first extension area and the second extension area.

17. The display apparatus of claim 16, wherein, in a state in which the first extension area and the second extension area are bent, emission pitches of the pixels in the first extension area and the second extension area, arranged adjacent to an end of the first extension area and an end of the second extension area are the same in the first extension area, in the second extension area, and between the first extension area and the second extension area.

18. The display apparatus of claim 17, wherein, in the state in which the first extension area and the second extension area are bent, the emission pitches of the pixels arranged adjacent to the boundary between the middle area and the plurality of extension areas are the same as the emission pitches of the pixels arranged adjacent to the end of the first extension area and the end of the second extension area, in the first extension area, in the second extension area, and between the first extension area and the second extension area.

* * * * *